(12) United States Patent
Matsumoto et al.

(10) Patent No.: US 12,163,633 B2
(45) Date of Patent: Dec. 10, 2024

(54) LIGHT-EMITTING DEVICE, LIGHTING APPLIANCE, AND STREET LIGHT

(71) Applicant: NICHIA CORPORATION, Anan (JP)

(72) Inventors: Mika Matsumoto, Itano-gun (JP); Miyuki Kurata, Anan (JP); Kazushige Fujio, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 18/576,054

(22) PCT Filed: Feb. 22, 2022

(86) PCT No.: PCT/JP2022/007081
§ 371 (c)(1),
(2) Date: Jan. 2, 2024

(87) PCT Pub. No.: WO2023/276260
PCT Pub. Date: Jan. 5, 2023

(65) Prior Publication Data
US 2024/0310009 A1    Sep. 19, 2024

(30) Foreign Application Priority Data
Jul. 2, 2021 (JP) ................. 2021-110736

(51) Int. Cl.
*F21K 9/64* (2016.01)
*F21V 9/30* (2018.01)
*H01L 33/50* (2010.01)

(52) U.S. Cl.
CPC .................. *F21K 9/64* (2016.08); *F21V 9/30* (2018.02); *H01L 33/50* (2013.01)

(58) Field of Classification Search
CPC ..... F21K 9/64; F21K 9/60; F21K 9/00; F21V 9/30; F21V 9/32; F21V 9/38; H01L 33/50; H01L 33/502; H01L 33/504
See application file for complete search history.

(56) References Cited

U.S. PATENT DOCUMENTS

| 7,777,417 B2 | 8/2010 | Hayashi |
| 7,898,177 B2 | 3/2011 | Hayashi |

(Continued)

FOREIGN PATENT DOCUMENTS

| JP | 2008300694 A | 12/2008 |
| JP | 2010062272 A | 3/2010 |

(Continued)

OTHER PUBLICATIONS

Witherington et al. "Understanding, Assessing, and Resolving Light-Pollustion Problems on Sea Turtle Nesting Beaches", Florida Fish and Wildlife Conservation Commition, FMRI Technical Report TR-2, Version 2, 2014.

*Primary Examiner* — Bao Q Truong
(74) *Attorney, Agent, or Firm* — Hunton Andrews Kurth LLP

(57) ABSTRACT

Provided is a light-emitting device, a lighting appliance, and a street light that emit light with minimal negative effects on the behavior of sea turtles and which makes irradiated objects easily visible to humans. The light-emitting device includes a light-emitting element having an emission peak wavelength within a range from 400 nm to 490 nm; and a first phosphor having an emission peak wavelength within a range from 570 nm to 680 nm, wherein the light-emitting device, lighting appliance, and street light emit light that has a correlated color temperature of 1950 K or less, an average color rendering index Ra of 40 or greater, a full width at half maximum of an emission spectrum indicating a maximum emission intensity in an emission spectrum of the light-emitting device of 110 nm or less, and a sea turtle light attraction index T derived from Equation (1) of 0.416 or less.

20 Claims, 23 Drawing Sheets

(56) References Cited

U.S. PATENT DOCUMENTS

| | | | |
|---|---|---|---|
| 8,344,622 B2 | 1/2013 | Hayashi | |
| 8,530,250 B2 | 9/2013 | Ichikawa et al. | |
| 9,181,471 B2 * | 11/2015 | Kang | C09K 11/883 |
| 9,287,476 B2 | 3/2016 | Ichikawa et al. | |
| 9,490,411 B2 | 11/2016 | Ichikawa et al. | |
| 9,537,071 B2 | 1/2017 | Ichikawa et al. | |
| 10,115,870 B2 | 10/2018 | Ichikawa et al. | |
| 10,573,788 B2 | 2/2020 | Ichikawa et al. | |
| 10,573,789 B2 | 2/2020 | Ichikawa et al. | |
| 10,700,241 B2 | 6/2020 | Ichikawa et al. | |
| 10,837,607 B2 * | 11/2020 | Soer | C09K 11/0883 |
| 11,094,854 B2 | 8/2021 | Ichikawa et al. | |
| 11,177,423 B2 * | 11/2021 | Watanabe | H01L 23/28 |
| 2008/0298063 A1 | 12/2008 | Hayashi | |
| 2010/0264449 A1 | 10/2010 | Hayashi | |
| 2011/0111082 A1 | 5/2011 | Hayashi | |
| 2011/0210354 A1 | 9/2011 | Ichikawa et al. | |
| 2014/0084320 A1 | 3/2014 | Ichikawa et al. | |
| 2016/0049566 A1 | 2/2016 | Ichikawa et al. | |
| 2016/0056357 A1 | 2/2016 | Ichikawa et al. | |
| 2017/0141273 A1 | 5/2017 | Ichikawa et al. | |
| 2018/0301600 A1 | 10/2018 | Ichikawa et al. | |
| 2019/0035981 A1 | 1/2019 | Ichikawa et al. | |
| 2019/0088825 A1 | 3/2019 | Ichikawa et al. | |
| 2019/0093832 A1 | 3/2019 | Soer et al. | |
| 2020/0287096 A1 | 9/2020 | Ichikawa et al. | |
| 2021/0018152 A1 | 1/2021 | Soer et al. | |
| 2021/0098656 A1 * | 4/2021 | Sato | H01L 33/60 |
| 2021/0336094 A1 | 10/2021 | Ichikawa et al. | |
| 2022/0146058 A1 | 5/2022 | Soer et al. | |

FOREIGN PATENT DOCUMENTS

| | | |
|---|---|---|
| JP | 2015149454 A | 8/2015 |
| JP | 2020057756 A | 4/2020 |
| JP | 2020535651 A | 12/2020 |
| WO | 2018212300 A1 | 11/2018 |

* cited by examiner

LIGHT-EMITTING DEVICE, LIGHTING APPLIANCE, AND STREET LIGHT

CROSS-REFERENCE TO RELATED APPLICATION

This application is a national stage entry of International Application No. PCT/JP2022/007081, filed on Feb. 22, 2022, which claims priority to Japanese Patent Application No. 2021-110736, filed on Jul. 2, 2021, the disclosures of which are hereby incorporated by reference in their entireties.

TECHNICAL FIELD

The present invention relates to a light-emitting device, a lighting appliance, and a street light.

BACKGROUND ART

As a light source of a lighting appliance installed outdoors, such as a street light or a road illumination light, high-pressure mercury lamps, metal halide lamps, sodium lamps, and light-emitting diode (LED) lamps using light-emitting elements such as LEDs are used.

It is known that night-time lighting by light from a lighting appliance installed outdoors affects various ecosystems. For example, lighting that illuminates a sand beach where sea turtles lay eggs has an effect on the biology of the sea turtles. Sea turtle females arrive on the sand beaches to lay eggs and baby turtles escape from the nest to the surface and journey out to the sea in the dark of the night. When a sand beach is brightly illuminated, the female will avoid areas illuminated by lighting, and even a small stimulation may cause the female to give up laying eggs and return to the sea even after arriving on land. One method for overcoming the effects of light on the sand beach includes changing the light sources to sodium lamps which emit a yellow light with relatively little effect on sea turtles.

However, sodium lamps use mercury as the light-emitting material. Thus, in accordance with the Minamata Convention on Mercury, there is a need to replace lighting fixtures with those that use a safe light-emitting material.

The light-emitting device described in Patent Document 1 includes a mounting substrate, a plurality of LED elements mounted on the mounting substrate, and a sealing resin including phosphor particles and titanium dioxide particles to seal the plurality of LED elements, wherein the titanium dioxide particles attenuate light emitted from the LED elements when light passes through the sealing resin.

The light-emitting device that attenuates light emitted from the LED elements described in Patent Document 1 and the sodium lamp described above have a low color rendering property, make irradiated objects difficult for humans to see well, and may not be suited to lighting for roads and the like for humans and vehicles near a sand beach.

CITATION LIST

Patent Literature

Patent Document 1: WO 2018/212300

SUMMARY OF INVENTION

Technical Problem

An object of an aspect of the present invention is to provide a light-emitting device, a lighting appliance, and a street light that emit light with minimal negative effects on the behavior of sea turtles and which makes irradiated objects easily visible to humans.

Solution to Problem

A first aspect is a light-emitting device including a light-emitting element having an emission peak wavelength within a range from 400 nm to 490 nm; and a first phosphor having an emission peak wavelength within a range from 570 nm to 680 nm, wherein the light-emitting device emits light that has a correlated color temperature of 1950 K or less, an average color rendering index Ra of 40 or greater, a full width at half maximum of an emission spectrum indicating a maximum emission intensity in an emission spectrum of the light-emitting device of 110 nm or less, and a sea turtle light attraction index T derived from Equation (1) of 0.416 or less.

[Math. 1]

$$T = \frac{\int_{360}^{700} S(\lambda) \times R_t(\lambda) d\lambda}{\int_{380}^{730} S(\lambda) \times V(\lambda) d\lambda} \tag{1}$$

Here, $S(\lambda)$ is a spectral radiance of light emitted by the light-emitting device, $V(\lambda)$ is the spectral luminous efficiency function for human photopic vision specified by the Commission Internationale de l'Eclairage (CIE), and $R_t(\lambda)$ is a sea turtle light response curve.

A second aspect is a light-emitting device including a light-emitting element having an emission peak wavelength within a range from 400 nm to 490 nm; and a first phosphor having an emission peak wavelength within a range from 570 nm to 680 nm, wherein the first phosphor includes a first nitride phosphor having a composition represented by Formula (1A), and the light-emitting device emits light that has a correlated color temperature of 1950 K or less, a full width at half maximum of an emission spectrum indicating a maximum emission intensity in an emission spectrum of the light-emitting device of 110 nm or less, and a sea turtle light attraction index T derived from Equation (1) of 0.416 or less.

$$M^1{}_2Si_5N_8:Eu \tag{1A}$$

Here, $M^1$ is an alkaline earth metal element including at least one selected from the group consisting of Ca, Sr, and Ba.

A third aspect is a lighting appliance including the light-emitting device.

A fourth aspect is a street light including the light-emitting device.

Advantageous Effects of Invention

According to an aspect of the present invention, a light-emitting device, a lighting appliance, and a street light can be provided that emit light with minimal negative effects on the behavior of sea turtles and which makes an irradiated object easily visible to humans.

DESCRIPTION OF EMBODIMENTS

An embodiment of a light-emitting device, a lighting appliance, and a street light according to the present invention will be described below. However, the following embodiments of the light-emitting device, the lighting appliance, and the street light are implementations of the technical ideas of the present invention, and the present invention is not limited to the light-emitting device and the lighting appliance and street light provided with the light-emitting device described below.

Note that the relationship between the color name and the chromaticity coordinates, and the relationship between the wavelength range of light and the color name of monochromatic light, and the like conform to JIS Z 8110. Also, if a plurality of substances applicable to each component in a composition are present, the content of each component in the composition refers to the total amount of the plurality of substances present in the composition, unless otherwise specified.

A light-emitting device of a first embodiment includes a light-emitting element having an emission peak wavelength within a range from 400 nm to 490 nm; and a first phosphor having an emission peak wavelength within a range from 570 nm to 680 nm, wherein the light-emitting device emits light that has a correlated color temperature of 1950 K or less, an average color rendering index Ra of 40 or greater, a full width at half maximum of a light-emitting device indicating a maximum emission intensity in an emission spectrum of the light-emitting device of 110 nm, and a sea turtle light attraction index T derived from Equation (1) of 0.416 or less.

[Math. 2]

$$T = \frac{\int_{360}^{700} S(\lambda) \times R_t(\lambda) d\lambda}{\int_{380}^{730} S(\lambda) \times V(\lambda) d\lambda} \quad (1)$$

Here S(λ) is a spectral radiance of light emitted by the light-emitting device, V(λ) is the spectral luminous efficiency function for human photopic vision specified by the Commission Internationale de l'Eclairage (CIE), and $R_t(λ)$ is a sea turtle light response curve.

A light-emitting device of a second embodiment includes a light-emitting element having an emission peak wavelength within a range from 400 nm to 490 nm; and a first phosphor having an emission peak wavelength within a range from 570 nm to 680 nm, wherein the first phosphor includes a first nitride phosphor having a composition represented by Formula (1A), and the light-emitting device emits light that has a correlated color temperature of 1950 K or less, a full width at half maximum of an emission spectrum indicating a maximum emission intensity in an emission spectrum of the light-emitting device of 110 nm or less, and a sea turtle light attraction index T derived from Equation (1) of 0.416 or less.

$$M^1_2Si_5N_8:Eu \qquad (1A)$$

Here, $M^1$ is an alkaline earth metal element including at least one selected from the group consisting of Ca, Sr, and Ba.

Figure 1:
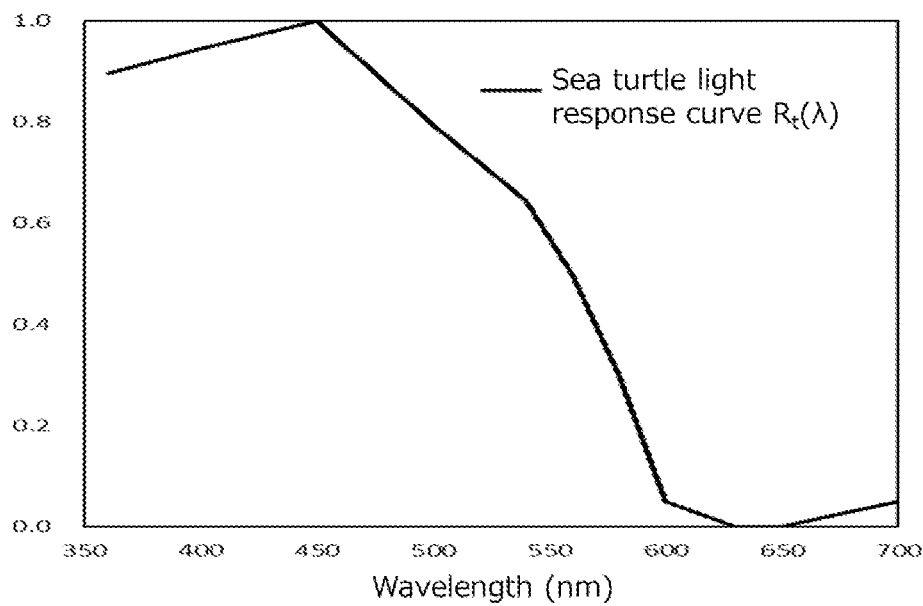
FIG. 1 is a diagram illustrating a sea turtle light response curve $R_t(\lambda)$.

It is thought that sea turtles use brightness to determine the direction of the sea. Both in the lab and the field, sea turtles move toward a bright light source, and on a beach, the sea turtles move toward an object that reflects light. FIG. 1 is a light response curve for sea turtles (Non-Patent Document: Orientation Response Curve (Witherington et al., "Understanding, Assessing, and Resolving Light-Pollution Problems on Sea Turtle Nesting Beaches", Florida Fish and Wildlife Research Institute TECHNICAL REPORTS, FWRI Technical Report TR-2, Version 2, 2014, Florida Fish and Wildlife Conservation Commission), and is specifically a light response curve for green sea turtle hatchlings. Not only green sea turtle hatchings, but also green sea turtle babies and adults as well as other species of turtles (for example, the hawksbill sea turtle, the loggerhead sea turtle, and the like) prefer short wavelength light and can be expected to be attracted to light from the near ultraviolet region to the yellow region of 560 nm or less. From the light response curve $R_t(λ)$ for sea turtles illustrated in FIG. 1, it can be confirmed that sea turtles are attracted to light of 560 nm or less. Thus, when a light emitted from a street light at night-time is a light that attracts sea turtles, there is a high possibility that the sea turtles are disorientated from the direction of the sea. Also, sea turtles most of the time see the world through the filter of the blue sea, and thus, as water selectively absorbs reddish long wavelength light, sea turtles are most sensitive to short wavelength light.

Figure 2:
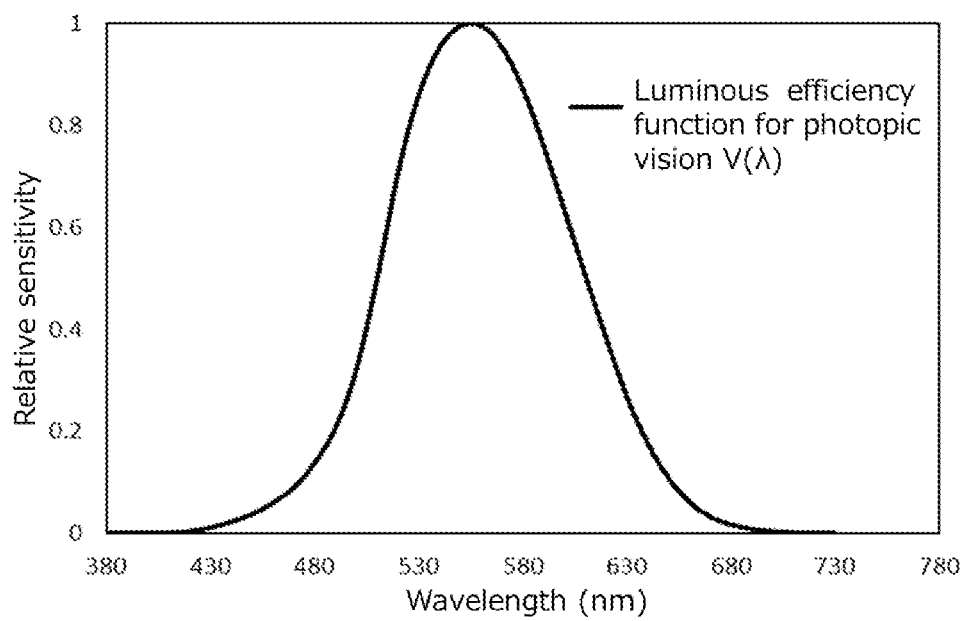
FIG. 2 is a diagram illustrating a luminous efficiency function for human photopic vision $V(\lambda)$.

FIG. 2 is a luminous efficiency function for human photopic vision V(λ) specified by the CIE. The maximum sensitivity (sensitivity peak wavelength) of the luminous efficiency function for human photopic vision is 555 nm. If light in the wavelength range of 560 nm or less, which attracts sea turtles, is made to not be emitted to keep the sea turtles from getting lost, irradiated objects become less visible to humans.

A light-emitting device can emit light with a sea turtle light attraction index T of 0.416 or less derived from Equation (1) below, which is a ratio of the radiance of the light-emitting device taking into account the sea turtle light response curve in a range from 360 nm to 700 nm to the brightness of the light-emitting device in a range from 380 nm to 730 nm taking into account the luminous efficiency for human photopic vision specified by the CIE. Thus, the light-emitting device can emit light with a reduced attraction to sea turtles and that allows irradiated objects to be easily visible to humans. The light-emitting device preferably emits light with a sea turtle light attraction index T derived from Equation (1) of 0.415 or less, more preferably of 0.410 or less, even more preferably 0.400 or less, yet even more preferably 0.395 or less, and particularly preferably 0.390 or less. The light-emitting device may emit light with a sea turtle light attraction index T derived from Equation (1) of 0, but taking into account making irradiated objects easily visible to humans, the sea turtle light attraction index T derived from Equation (1) is preferably 0.01 or greater, more preferably 0.05 or greater, even more preferably 0.100 or greater, yet even more preferably 0.150 or greater, and particularly preferably 0.200 or greater.

Color temperature may be used as an objective measurement representing the color of the light emitted by a white light. When a black body is heated from the outside and the temperature is increased, the color changes from black, to dark red, to red, to yellow, to orange, to white, and to bluish white. The temperature of a black body can be represented in Kelvins (K), a correlated color temperature (CCT; K) and a color deviation duv from the black body radiation locus can be measured in accordance with JIS Z8725, and an average color rendering index Ra can be measured in accordance with JIS Z8726. Typically, the color temperature is approximately 800 K for an open fire, approximately 1900 K for the flame of a candle, approximately 2900 K for the light of an incandescent lamp, and approximately 4200 K for the light of a fluorescent lamp.

The light-emitting device emits light having a correlated color temperature of 1950 K or less, having reduced light on the short wavelength side that sea turtles are sensitive to, and that gives a relaxing atmosphere. The correlated color temperature of the light emitted by the light-emitting device may be 1920 K or less or 1900 K or less. The correlated color temperature of the light emitted from the light-emitting device is preferably 800 K or greater, preferably 1000 K or greater, may be 1200 K or greater, may be 1500 K or greater, or may be 1700 K or greater.

The color rendering property represents the degree to which an irradiated object appears at the same correlated color temperature. The average color rendering index Ra, an average value of the numerical values from R1 to R8, of the light emitted by the light-emitting device can be measured in accordance with a method for evaluating color rendering properties for light sources in JIS Z8726. The average color rendering index Ra of the light emitted by the light-emitting device is 5 or greater, may be 10 or greater, 20 or greater, 30 or greater, or 40 or greater, is preferably 51 or greater, and is more preferably 52 or greater. As the value of the average color rendering index Ra of the light emitted by the light-emitting device approaches 100, the color rendering property comes closer to that of the reference light source at the same correlated color temperature. It is sufficient that an outdoor lighting appliance such as a street light or a road illumination light or a lighting appliance installed indoors but at a place near the outdoors emits light having an average color rendering index Ra of 5 or greater. If the average color rendering index Ra of the light emitted by light-emitting device is 40 or greater, the color rendering property is of a degree required for a workplace where goods are sorted, and is sufficient as a light for lighting outdoors and places indoors but near the outdoors so that vehicles can be driven, people can walk, and light tasks can be performed. The average color rendering index Ra of the light emitted by light-emitting device may be 53 or greater, 99 or less, 95 or less, or 89 or less.

A special color rendering index R9 of light emitted by the light-emitting device is an index for evaluating red color. The special color rendering index R9 of the light emitted by the light-emitting device may be a negative numerical value. The special color rendering index R9 of the light emitted by the light-emitting device may be within a range of minus (−) 150 to plus (+) 99, within a range of −140 to +98, or within a range of −135 to 95.

With the light-emitting device, the full width at half maximum of the emission spectrum indicating the maximum emission intensity in the emission spectrum of the light-emitting device is 110 nm or less and may be 100 nm or less, 95 nm or less, 90 nm or less, and 3 nm or greater, 40 nm or greater, 60 nm or greater, or 70 nm or greater. In the emission spectrum of the light-emitting device, when the full width at half maximum of the emission spectrum indicating the maximum emission intensity is large, the light components on the long wavelength side which are difficult for humans to perceive are increased or the light components on the short wavelength side which tend to stimulate the sea turtles are increased. When the light components on the long wavelength side increase, the luminance of the light emitted by the light-emitting device tends to decrease. When the light components on the short wavelength side increase, sea turtles tend to be stimulated and light that disorientates the sea turtles from the direction of the sea tends to be emitted. In addition, in the emission spectrum of the light-emitting device, when the full width at half maximum of the emission spectrum indicating the maximum emission intensity is small, the light components in a specific wavelength range tend to increase. To provide a light-emitting device that emits light that makes irradiated objects easily visible to humans and has reduced sea turtle light attraction without reduced brightness, the light-emitting device preferably has a full width at half maximum of the emission spectrum indicating the maximum emission intensity in the emission spectrum of 110 nm or less. In the specification, the full width at half maximum refers to a wavelength width at which the emission intensity is 50% of the emission intensity at the emission peak wavelength indicating the maximum emission intensity in the emission spectrum.

In the emission spectrum of the light-emitting device, the full width at half maximum of the emission spectrum indicating the maximum emission intensity may be narrower than the full width at half maximum of the emission spectrum having the emission peak wavelength of the first phosphor included in the light-emitting device or the full width at half maximum of the emission spectrum having the emission peak wavelength of a second phosphor described below. For example, in a case in which the first phosphor and the second phosphor having emission peak wavelengths in different wavelength ranges are included, the emission intensity changes in a region where the emission spectrum of the first phosphor and the emission spectrum of the second phosphor overlap. As a result, the emission spectrum of the mixed color light emitted by the light-emitting device is different from the emission spectrum of the first phosphor or the emission spectrum of the second phosphor, and the full width at half maximum thereof may be narrower than the full width at half maximum of the emission spectrum having the emission peak wavelength of the first phosphor or the full width at half maximum of the emission spectrum having the emission peak wavelength of the second phosphor.

In the light-emitting device, the emission peak wavelength having the maximum emission intensity in the emission spectrum of the light-emitting device is preferably within a range from 570 nm to 680 nm and may be within a range from 575 nm to 680 nm or within a range from 575 nm to 670 nm. The range of the emission peak wavelength having the maximum emission intensity in the emission spectrum of the light-emitting device may overlap with the range of the emission peak wavelength of the first phosphor. The emission peak wavelength having the maximum emission intensity in the emission spectrum of the light-emitting device may be derived from the light emission of the first phosphor.

Light-Emitting Element

The light-emitting element has an emission peak wavelength within a range from 400 nm to 490 nm. The emission peak wavelength of the light-emitting element is preferably within a range from 420 nm to 480 nm and may be within a range from 440 nm to 460 nm. The light-emitting device emits light that has a correlated color temperature of 1950 K or less, that has warmth, and that gives a relaxing atmosphere via a mixed color light including the light emitted by the light-emitting elements and the light emitted by the first phosphor and the light emitted by the second phosphor as necessary. At least a part of the light emitted by the light-emitting element is used as excitation light for the first phosphor, and when the second phosphor is included, the light is used as excitation light for the second phosphor. In addition, a part of light emitted by the light-emitting element is used as light emitted from the light-emitting device. The full width at half maximum of the emission spectrum having an emission peak wavelength in the emission spectrum of the light-emitting element is preferably 30 nm or less, more preferably 25 nm or less, and even more preferably 20 nm or less. As the light-emitting element, for example, a semiconductor light-emitting element that uses a nitride-based semiconductor is preferably used. Accordingly, it is possible to achieve a stable light-emitting device that exhibits high efficiency and high output linearity with respect to an input and that is strong against mechanical impact.

First Phosphor

The light-emitting device includes the first phosphor having an emission peak wavelength within a range from 570 nm to 680 nm. The first phosphor emits light having an emission peak wavelength within a range from 570 nm to 680 nm when excited by light emitted by a light-emitting element having an emission peak wavelength within a range from 400 nm to 490 nm. The first phosphor may have an emission peak wavelength within a range from 575 nm to 670 nm or may have an emission peak wavelength within a range from 580 nm to 660 nm. For the first phosphor, the full width at half maximum of the emission spectrum having an emission peak wavelength in the emission spectrum of the first phosphor is preferably within a range from 3 nm to 120 nm. The full width at half maximum of the emission spectrum having an emission peak wavelength in the emission spectrum of the first phosphor is preferably within a range from 3 nm to 15 nm or within a range from 60 nm to 120 nm. To emit light from the light-emitting device with a correlated color temperature that gives a feeling of warmth and a relaxing atmosphere, the full width at half maximum of the emission spectrum having an emission peak wavelength of the first phosphor is preferably within a range from 3 nm to 120 nm.

The first phosphor preferably includes at least one selected from the group consisting of a first nitride phosphor having the composition represented by Formula (1A), a second nitride phosphor having the composition represented by Formula (1B), a first fluoride phosphor represented by Formula (1C), and a second fluoride phosphor having the composition represented by Formula (1C') with a different composition to that represented by Formula (1C). The first phosphor preferably essentially includes the first nitride phosphor having the composition represented by Formula (1A). Since the light-emitting device includes the first phosphor, the light-emitting device can emit light with a correlated color temperature of 1950 K or less, a full width at half maximum of the emission spectrum indicating the maximum emission intensity in the emission spectrum of the light-emitting device of 110 nm or less, and a sea turtle light attraction index T derived from Equation (1) of 0.416 or less.

$$M^1{}_2Si_5N_8:Eu \tag{1A}$$

Here, $M^1$ is an alkaline earth metal element including at least one selected from the group consisting of Ca, Sr, and Ba.

$$Sr_qCa_sAl_tSi_uN_v:Eu \tag{1B}$$

Here, q, s, t, u, and v satisfy 0≤q<1, 0<s≤1, q+s≤1, 0.9≤t≤1.1, 0.9≤u≤1.1, and 2.5≤v≤3.5.

$$A_c[M^2{}_{1-b}Mn^{4+}{}_bF_d] \tag{1C}$$

Here, A includes at least one selected from the group consisting of $K^+$, $Li^+$, $Na^+$, $Rb^+$, $Cs^+$, and $NH_4^+$, and among these, $K^+$ is preferable. $M^2$ includes at least one element selected from the group consisting of group 4 elements and group 14 elements, and among these, Si and Ge are preferable. b satisfies 0<b<0.2, c is an absolute value of electric charge of $[M^2{}_{1-b}Mn^{4+}{}_bF_d]$ ion, d satisfies 5<d<7).

$$A'_{c'}[M^{2'}{}_{1-b'}Mn^{4+}{}_{b'}F_{d'}] \tag{1C'}$$

Here, A' contains at least one selected from the group consisting of $K^+$, $Li^+$, $Na^+$, $Rb^+$, $Cs^+$, and $NH_4^+$, and among these, $K^+$ is preferable. $M^{2'}$ includes at least one element selected from the group consisting of group 4 elements, group 13 elements, and group 14 elements, and among these, Si and Al are preferable. b' satisfies 0<b'<0.2, c' is an absolute value of electric charge of $[M^{2'}{}_{1-b'}Mn^{4+}{}_{b'}F_{d'}]$ ion, and d' satisfies 5<d'<7). In the present specification, in the formulae representing the compositions of the phosphors, the characters preceding the colon (:) represent a mole ratio for elements in one mole of composition of a host crystal and a phosphor, and the characters following the colon (:) represent an activating element.

The first phosphor preferably includes at least one selected from the group consisting of a first nitride phosphor having the composition represented by Formula (1A), a second nitride phosphor having the composition represented by Formula (1B), a first fluoride phosphor represented by Formula (1C), a second fluoride phosphor having the composition represented by Formula (1C') with a different composition to that represented by Formula (1C), a fluorogermanate phosphor having the composition represented by Formula (D), a fourth nitride phosphor having the composition represented by Formula (1E), and a first sulfide phosphor having the composition represented by Formula (1F), as described below. The first phosphor may include one type of phosphor alone or may include two or more types of phosphors. A light-emitting device of a second embodiment includes, as the first phosphor, the first nitride phosphor having the composition represented by Formula (1A). Since the first phosphor includes the first nitride phosphor having the composition represented by Formula (1A), the first phosphor can emit light with a correlated color temperature of 1950 K or less, a full width at half maximum of the emission spectrum indicating the maximum emission intensity in the emission spectrum of the light-emitting device of 110 nm or less, and a sea turtle light attraction index T derived from Equation (1) of 0.416 or less. The light-emitting device according to the second embodiment preferably includes, as the first phosphor, at least one selected from the group consisting of the second nitride phosphor having the composition represented by Formula (1B) and a fluoride phosphor having the composition represented by Formula (1C).

The first phosphor may include at least one phosphor selected from the group consisting of a fluorogermanate phosphor, a fourth nitride phosphor, and a first sulfide phosphor. The fluorogermanate phosphor has a composition represented by the following Formula (1D), for example. The fourth nitride phosphor has a composition represented by the following Formula (1E), for example. The first sulfide phosphor has a composition represented by the following Formula (1F), for example.

$$(i-j)MgO\cdot(j/2)Sc_2O_3\cdot kMgF_2\cdot mCaF_2\cdot(1-n)GeO_2\cdot(n/2)M^3{}_2O_3:Mn \tag{1D}$$

Here, $M^3$ is at least one selected from the group consisting of Al, Ga, and In. i, j, k, m, n, and z may each satisfy 2≤i≤4, 0≤j≤0.5, 0<k<1.5, 0≤m<1.5, and 0≤n<0.5.

$$M^4{}_{v2}M^5{}_{w2}Al_{3-y2}Si_{y2}N_{z2}:M^6 \tag{1E}$$

Here, $M^4$ is at least one element selected from the group consisting of Ca, Sr, Ba, and Mg; $M^5$ is at least one element selected from the group consisting of Li, Na, and K; $M^6$ is at least one element selected from the group consisting of Eu, Ce, Tb, and Mn; and v2, w2, y2, and z2 each satisfy 0.80≤v2≤1.05, 0.80≤w2≤1.05, 0≤y2≤0.5, and 3.0≤ z2≤5.0.

$$(Ca,Sr)S:Eu \tag{1F}$$

In the present specification, a plurality of elements separated by commas (,) in a formula representing the composition of the phosphor may mean that at least one element among the plurality of elements is included in the composition and may mean that a combination of two or more among the plurality of elements is included.

The fluorogermanate phosphor having the composition represented by Formula (1D) may have a composition represented by the following Formula (1d), for example.

$$3.5\ MgO\cdot 0.5\ MgF_2\cdot GeO_2:Mn \tag{1d}$$

The fourth nitride phosphor having the composition represented by Formula (1E) may have the composition represented by the following Formula (1e).

$$M^4{}_{v2}M^5{}_{w2}M^6{}_{x2}Al_{3-y2}Si_{y2}N_{z2} \tag{1e}$$

Here, $M^4$, $M^5$, and $M^6$ have the same meanings as $M^4$, $M^5$, and $M^6$ in Formula (1E), v2, w2, y2, and z2 have the same meanings as v2, w2, y2, and z2 in Formula (1E), and x2 satisfies 0.001<x2≤0.1.

The fluorogermanate phosphor, the fourth nitride phosphor, and the first sulfide phosphor have emission peak wavelengths within a range from 570 nm to 680 nm and preferably have emission peak wavelengths within a range from 600 nm to 630 nm. The fluorogermanate phosphor, the fourth nitride phosphor, and the first sulfide phosphor each have a full width at half maximum of the emission spectrum having an emission peak wavelength in the emission spectrum of the first phosphor in a range from 5 nm to 100 nm and preferably in a range from 6 nm to 90 nm.

The light-emitting device of the first embodiment and the light-emitting device of the second embodiment may include one type of the first phosphor alone or may include two or more types of the first phosphor. Since the light-emitting device includes the first phosphor, the light-emitting device emits light with a correlated color temperature of 1950 K or less and that gives a relaxing atmosphere.

In a case in which, as the first phosphor, the first nitride phosphor having the composition represented by Formula (1A) is essentially included, all of the first phosphor may be the first nitride phosphor. In a case in which, as the first phosphor, the first nitride phosphor having the composition represented by Formula (1A) is essentially included and a first phosphor other than the first nitride phosphor having the composition represented by Formula (1A) is included, the mass ratio (first nitride phosphor/first phosphor other than the first nitride phosphor) between the first nitride phosphor and the first phosphor other than the first nitride phosphor blended in the first phosphor may be in a range from 99/1 to 1/99, a range from 98/2 to 10/90, or a range from 95/5 to 30/70. The first phosphor other than the first nitride phosphor having the composition represented by Formula (1A) corresponds to at least one phosphor selected from the group consisting of the second nitride phosphor having the composition represented by Formula (1B), the first fluoride phosphor represented by Formula (1C), the second fluoride phosphor represented by Formula (1C'), the fluorogermanate phosphor having the composition represented by Formula (1D), the fourth nitride phosphor having the composition represented by Formula (1E), and the first sulfide phosphor represented by Formula (1F).

The light-emitting device of the first embodiment or the light-emitting device of the second embodiment may include, as the first phosphor, at least one selected from the group consisting of the fluorogermanate phosphor having the composition represented by Formula (1D), the fourth nitride phosphor having the composition represented by Formula (1E), and the first sulfide phosphor having the composition represented by Formula (1F). The first phosphor may include one type of phosphor alone or may include two or more types of phosphors.

The content of the first phosphor included in the light-emitting device varies depending on the form and the like of the light-emitting device. In a case in which the first phosphor is included in a wavelength conversion member of the light-emitting device, the wavelength conversion member preferably includes phosphors and a light-transmissive material. The wavelength conversion member may include a wavelength conversion body including phosphors and a light-transmissive material. The total amount of the phosphors included in the wavelength conversion member may be 10 parts by mass or greater, 15 parts by mass or greater, 20 parts by mass or greater, 30 parts by mass or greater, 40 parts by mass or greater, or 50 parts by mass or greater relative to 100 parts by mass of the light-transmissive material. Also, the total amount may be 900 parts by mass or less, 800 parts by mass or less, 700 parts by mass or less, 600 parts by mass or less, 500 parts by mass or less, or 400 parts by mass or less. The total amount of the phosphors refers to the total amount of the first phosphor in a case in which the light-emitting device includes only the first phosphor and does not include a phosphor other than the first phosphor. The total amount of the phosphors refers to the total amount of the first phosphor and the second phosphor in a case in which the light-emitting device includes the first phosphor and the second phosphor.

In a case in which the light-emitting device includes the second phosphor described below, the content of the first phosphor included in the light-emitting device is preferably within a range from 5 mass % to 95 mass % with respect to the total amount of the first phosphor and the second phosphor. When the content of the first phosphor included in the light-emitting device is within a range from 5 mass % to 95 mass % with respect to the total amount of the first phosphor and the second phosphor, the light-emitting device can emit light having a correlated color temperature of 1950 K or less, a full width at half maximum of the emission spectrum indicating the maximum emission intensity in the emission spectrum of the light-emitting device of 110 nm or less, a sea turtle light attraction index T derived from Equation (1) of 0.416 or less, and a relaxing atmosphere with reduced light on the short wavelength side that sea turtles are sensitive to and are attracted to. The content of the first phosphor included in the light-emitting device may be within a range from 8 mass % to 80 mass %, a range from 10 mass % to 70 mass %, or a range from 11 mass % to 60 mass % with respect to the total amount of the first phosphor and the second phosphor.

Second Phosphor

The light-emitting device preferably includes the second phosphor having an emission peak wavelength within a range from 480 nm to less than 570 nm. The second phosphor preferably includes an emission peak wavelength within a range from 480 nm to 569 nm. The second phosphor emits light having an emission peak wavelength within a range from 480 nm to less than 570 nm when excited by light emitted by a light-emitting element having an emission peak wavelength within a range from 400 nm to 490 nm. The second phosphor, when excited by the light-emitting element, may have an emission peak wavelength within a range from 490 nm to 565 nm or may have an emission peak wavelength within a range from 495 nm to 560 nm. The second phosphor has a full width at half maximum of the emission spectrum having an emission peak wavelength in the emission spectrum of the second phosphor preferably within a range from 20 nm to 125 nm, and the full width at half maximum may be within a range from 25 nm to 124 nm or within a range from 30 nm to 123 nm. To emit light with a correlated color temperature that gives a feeling of warmth and a relaxing atmosphere, the full width at half maximum of the emission spectrum having an emission peak wavelength in the emission spectrum of the second phosphor is preferably within a range from 20 nm to 125 nm.

The second phosphor preferably includes at least one selected from the group consisting of a rare earth aluminate phosphor having the composition represented by Formula (2A) and a third nitride phosphor having the composition represented by Formula (2B).

$$Ln^1_3(Al_{1-a}Ga_a)_5O_{12}:Ce \qquad (2A)$$

Here, $Ln^1$ is at least one element selected from the group consisting of Y, Gd, Tb, and Lu, and a satisfies $0 \leq a \leq 0.5$.

$$La_wLn^2_xSi_6N_y:Ce_z \qquad (2B)$$

Here, $Ln^2$ essentially includes at least one selected from the group consisting of Y and Gd and may include at least one selected from the group consisting of Sc and Lu, and when the $Ln^2$ element included in 1 mol of the composition is 100 mol %, the total of Y and Gd included in $Ln^2$ is 90 mol % or greater, and w, x, y, and z satisfy $1.2 \leq w \leq 2.2$, $0.5 \leq x \leq 1.2$, $10 \leq y \leq 12.0$, $0.5 \leq z \leq 1.2$, $1.80 < w+x < 2.40$, and $2.9 \leq w+x+z \leq 3.1$.

In the rare earth aluminate phosphor having the composition represented by Formula (2A) and the third nitride phosphor having the composition represented by Formula (2B), the full width at half maximum of the emission peak having an emission peak wavelength in the emission spectrum of the phosphor is, for example, 90 nm or greater, preferably 100 nm or greater, and more preferably 110 nm or greater and, for example, 125 nm or less, preferably 124 nm or less, and more preferably 123 nm or less.

The second phosphor may include at least one phosphor selected from the group consisting of an alkaline earth metal aluminate phosphor and an alkaline earth metal halosilicate phosphor. The alkaline earth metal aluminate phosphor is, for example, a phosphor including at least strontium and activated with europium and has a composition represented by, for example, the following Formula (2C). Also, the alkaline earth metal halosilicate phosphor is, for example, a phosphor including at least calcium and chlorine and activated with europium and has a composition represented by, for example, the following Formula (2D).

$$Sr_4Al_{14}O_{25}:Eu \quad (2C)$$

$$(Ca,Sr,Ba)_8MgSi_4O_{16}(F,Cl,Br)_2:Eu \quad (2D)$$

Here, Sr may be partially substituted with at least one element selected from the group consisting of Mg, Ca, Ba, and Zn.

The alkaline earth metal aluminate phosphor having the composition represented by Formula (2C) and the alkaline earth metal halosilicate phosphor having the composition represented by Formula (2D) have emission peak wavelengths within a range from 480 nm to less than 520 nm and preferably have emission peak wavelengths within a range from 485 nm to 515 nm.

In the alkaline earth metal aluminate phosphor having the composition represented by Formula (2C) and the alkaline earth metal halosilicate phosphor having the composition represented by Formula (2D), the full width at half maximum of the emission peak having an emission peak wavelength in the emission spectrum of the phosphor is, for example, 30 nm or greater, preferably 40 nm or greater, and more preferably 50 nm or greater and, for example, 80 nm or less and preferably 70 nm or less.

The second phosphor may include at least one phosphor selected from the group consisting of a β-SiAlON phosphor, a second sulfide phosphor, a scandium-based phosphor, and an alkaline earth metal silicate-based phosphor. The β-SiAlON phosphor has a composition represented by the following Formula (2E), for example. The second sulfide phosphor has the composition represented by the following Formula (2F), for example. The scandium-based phosphor has a composition represented by the following Formula (2G), for example. The alkaline earth metal silicate-based phosphor has, for example, the composition represented by the following Formula (2H) or the composition represented by the following Formula (21).

$$Si_{6-g}Al_gO_gN_{8-g}:Eu(0<g\leq4.2) \quad (2E)$$

$$(Sr,M^7)Ga_2S_4:Eu \quad (2F)$$

Here, $M^7$ is at least one element selected from the group consisting of Be, Mg, Ca, Ba, and Zn.

$$(Ca,Sr)Sc_2O_4:Ce \quad (2G)$$

$$(Ca,Sr)_3(Sc,Mg)_2Si_3O_{12}:Ce \quad (2H)$$

$$(Ca,Sr,Ba)_2SiO_4:Eu \quad (21)$$

The β-SiAlON phosphor, the second sulfide phosphor, the scandium-based phosphor, and the alkaline earth metal silicate-based phosphor have emission peak wavelengths within a range from 520 nm to less than 580 nm and preferably have emission peak wavelengths within a range from 525 nm to 565 nm. In the β-SiAlON phosphor, the second sulfide phosphor, the scandium-based phosphor, and the alkaline earth metal silicate-based phosphor, the full width at half maximum of the emission spectrum having an emission peak wavelength in the emission spectrum of the second phosphor is, for example, 20 nm or greater and preferably 30 nm or greater and, for example, 120 nm or less and preferably 115 nm or less.

The second phosphor may include at least one phosphor selected from the group consisting of the rare earth aluminate phosphor having the composition represented by Formula (2A), the third nitride phosphor having the composition represented by Formula (2B), the alkaline earth metal aluminate phosphor having the composition represented by Formula (2C), the alkaline earth metal halosilicate phosphor having the composition represented by Formula (2D), the β-SiAlON phosphor having the composition represented by Formula (2E), the second sulfide phosphor having the composition represented by Formula (2F), the scandium-based phosphor having the composition represented by Formula (2G), the alkaline earth metal silicate-based phosphor having the composition represented by Formula (2H), and the alkaline earth metal silicate-based phosphor having the composition represented by Formula (21). The second phosphor may include one type of phosphor alone or may include two or more types.

The light-emitting device preferably emits light having a color deviation Duv, which is a deviation from a black body radiation locus, preferably in a range from minus (−) 0.008 to plus (+) 0.008. The color deviation Duv is a deviation from the black body radiation locus of light emitted from the light-emitting device and is measured according to JIS Z8725. Even in the case of a relatively low correlated color temperature of 1950 K or less, when the color deviation Duv from the black body radiation locus (Duv: 0.000) on the CIE 1931 chromaticity diagram is within a range from −0.008 to +0.008, light that allows irradiated objects to have a natural color and causes minimal discomfort to humans is emitted from the light-emitting device. The light-emitting device emits light having the color deviation Duv, which is a deviation from the black body radiation locus at 1950 K or less, preferably within a range from −0.008 to +0.008, more preferably within a range from −0.006 to +0.006, and even more preferably within a range from −0.003 to +0.003. When light is emitted having the color deviation Duv, which is a deviation from the black body radiation locus at 1950 K or less, of greater than 0.008, the color of irradiated objects deviates from the natural color, which may cause discomfort to humans.

Figure 3:
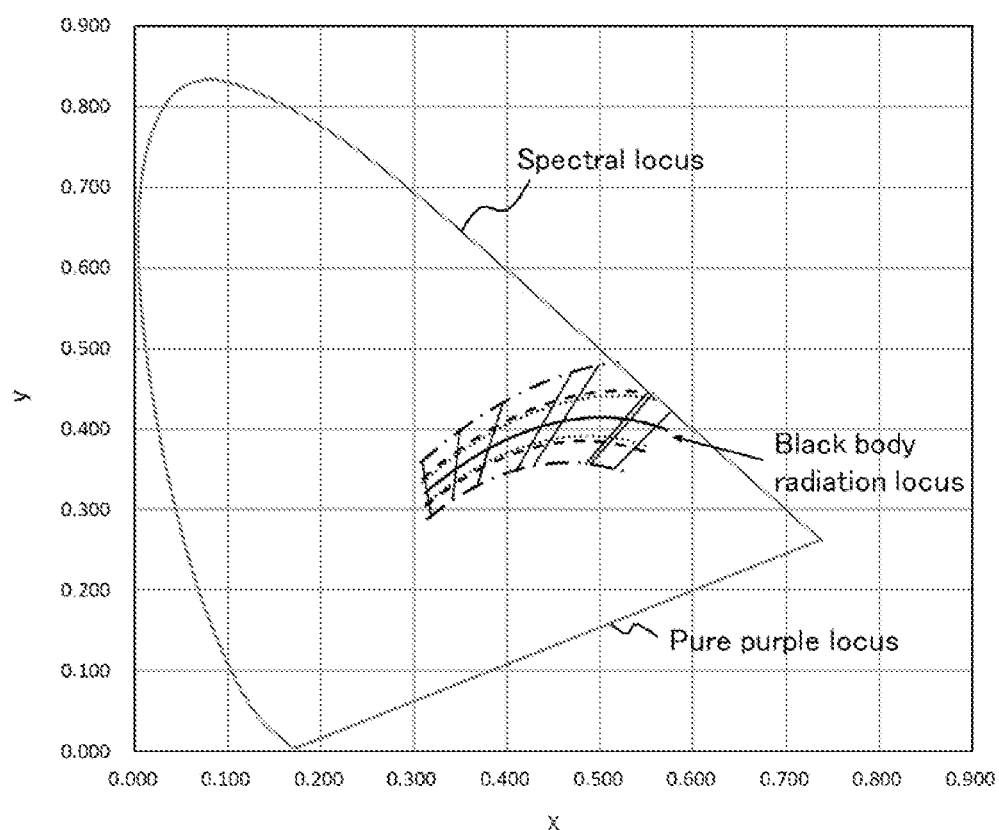
FIG. 3 is a CIE 1931 chromaticity diagram illustrating a black body radiation locus within the spectral locus and pure purple locus on the CIE 1931 chromaticity diagram and color deviations from the black body radiation locus.
Figure 4:
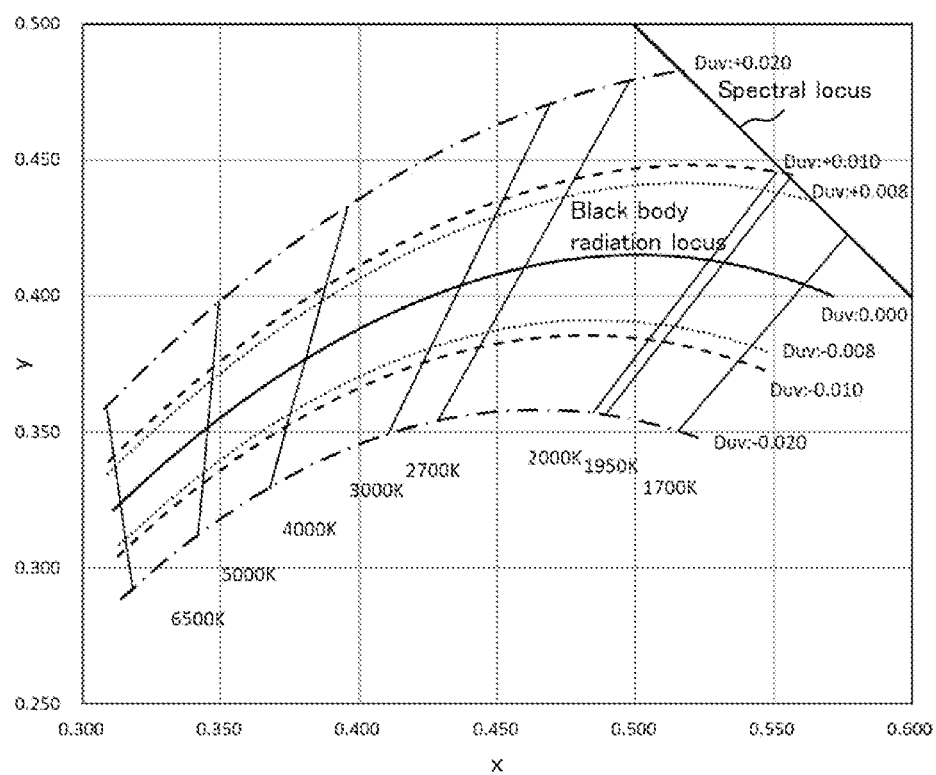
FIG. 4 is a partially enlarged view of FIG. 3 illustrating a black body radiation locus on the CIE 1931 chromaticity diagram in which the chromaticity coordinate x is within a range from 0.300 to 0.600 and the chromaticity coordinate y is within a range from 0.250 to 0.500, and each locus of color deviations from the black body radiation locus at each correlated color temperature.

FIG. 3 is a diagram illustrating a black body radiation locus (Duv: 0.000) within the spectral locus and pure purple locus on the CIE 1931 chromaticity diagram and color deviations from the black body radiation locus. FIG. 4 is a partially enlarged view of FIG. 3 illustrating a black body radiation locus on the CIE 1931 chromaticity diagram in which the chromaticity coordinate x is within a range from 0.300 to 0.600 and the chromaticity coordinate y is within a range from 0.250 to 0.500, and each locus of color deviations from the black body radiation locus at each correlated color temperature with Duv of −0.020, Duv of −0.010, Duv of −0.008, Duv of +0.008, Duv of +0.010, and Duv of +0.020. As illustrated in FIGS. 3 and 4, the straight lines intersecting with the black body radiation locus (Duv: 0.000) are each an isotemperature line at each correlated color temperature (CCT of 1700 K, 1950 K, 2000 K, 2700

K, 3000 K, 4000 K, 5000 K, and 6500 K). In a case in which the color deviation Duv of the mixed color light emitted from the light-emitting device is 0, this indicates that the locus thereof has no deviation from the black body radiation locus and is approximately the black body radiation locus.

The light-emitting device preferably emits light having a second radiance in a range from 650 nm to 750 nm being 50% or less with respect to 100% of a first radiance in a range from 400 nm to 750 nm. The details thereof are indicated by Equation (2) below. In the light emitted by the light-emitting device, the ratio of the second radiance in a range from 650 nm to 750 nm to 100% of the first radiance in a range from 400 nm to 750 nm is also referred to as Lp. When the ratio Lp of the second radiance to the first radiance in the light emitted by light-emitting device is 50% or less, among the mixed color light emitted from the light-emitting device, there is a relatively small amount of light with red color components on the long wavelength side which are difficult for humans to perceive and also difficult for sea turtles to perceive due to sea water selectively absorbing light on the long wavelength side. Thus, the light emitted from the light-emitting device gives a relaxing atmosphere without reduced luminance. The ratio Lp of the second radiance to the first radiance of the light emitted by light-emitting device may be 45% or less, 40% or less, 35% or less, or 30% or less. The ratio Lp of the second radiance to the first radiance of the light emitted by the light-emitting device may be 5% or greater or 8% or greater in order to emit light having good color rendering property.

The ratio Lp of the second radiance to the first radiance of the light emitted by light-emitting device is derived from the following Equation (2). In the light emitted by the light-emitting device, a ratio Lp of the second radiance in a range from 650 nm to 750 nm to 100% of the first radiance in a range from 400 nm to 750 nm is the proportion of light with a long wavelength red color component in the mixed color light emitted by the light-emitting device.

[Math. 3]

$$Lp(\%) = \frac{\int_{650}^{750} S(\lambda)d\lambda}{\int_{400}^{750} S(\lambda)d\lambda} \times 100 \quad (2)$$

The light-emitting device preferably emits light having a relative sea turtle light attraction index ratio $T/T_0$ of 99% or less. The relative sea turtle light attraction index ratio $T/T_0$ refers to a ratio of the sea turtle light attraction index T derived from Equation (1) of the light-emitting device emitting light having a correlated color temperature of 1950 K or less when a reference sea turtle light attraction index $T_0$ of the light-emitting device emitting light having a correlated color temperature of greater than 1950 K is 100%. Regarding the reference sea turtle light attraction index $T_0$, a sea turtle light attraction index having the lowest numerical value among the light-emitting devices to be measured that emit light having a correlated color temperature of greater than 1950 K can be used as the reference attraction index $T_0$. When the relative attraction index ratio $T/T_0$ is as small as 99% or less, the light-emitting device can emit light which makes irradiated objects easily visible to humans and has reduced sea turtle light attraction without reduced brightness. When light having a relative attraction index ratio $T/T_0$ of less than 10% is emitted from a light-emitting device, for example, when light having a relative attraction index $T/T_0$ of 9% or less is emitted from a light-emitting device, the sea turtle light attraction reduction effect is greater than that of a light-emitting device that emits light having a correlated color temperature of greater than 1950 K, but the color balance of light is lost and the color rendering property is reduced. For example, to emit light that makes irradiated objects easily visible to humans and gives a relaxing atmosphere even with lighting for illuminating outdoors, such as a street light, the light-emitting device preferably emits light with a relative attraction index ratio $T/T_0$ within a range from 10% to 99%. The light-emitting device that emits light having a correlated color temperature of 1950 K or less may have a relative attraction index ratio $T/T_0$ within a range from 10% to 99%, within a range from 30% to 98%, or within a range from 40% to 96%.

The reference sea turtle light attraction index $T_0$ of a light-emitting device that emits light having a correlated color temperature of greater than 1950 K can be derived from the following Equation (3).

[Math. 4]

$$T_0 = \frac{\int_{360}^{700} S_0(\lambda) \times R_t(\lambda)d\lambda}{\int_{380}^{730} S_0(\lambda) \times V(\lambda)d\lambda} \quad (3)$$

Here, $T_0$ is a sea turtle light attraction index of a light-emitting device having a correlated color temperature of greater than 1950 K, $S_0(\lambda)$ is a spectral radiance of light emitted by the light-emitting device having a correlated color temperature of greater than 1950 K, and $V(\lambda)$ and $R_t(\lambda)$ have the same meanings as in Equation (1).

The relative attraction index ratio $T/T_0$ (%) can be derived from the following Equation (4).

[Math. 5]

$$T/T_0(\%) = \frac{\int_{360}^{700} S(\lambda) \times R_t(\lambda)d\lambda / \int_{380}^{780} S(\lambda) \times V(\lambda)d\lambda}{\int_{360}^{700} S_0(\lambda) \times R_t(\lambda)d\lambda / \int_{380}^{780} S_0(\lambda) \times V(\lambda)d\lambda} \times 100 \quad (4)$$

Figure 5:
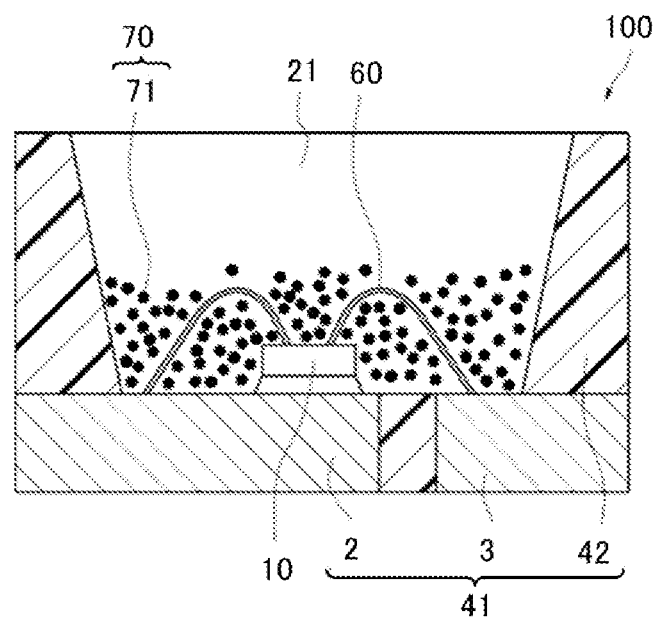
FIG. 5 is a schematic cross-sectional view illustrating an example of the light-emitting device of the first configuration example.
Figure 6:
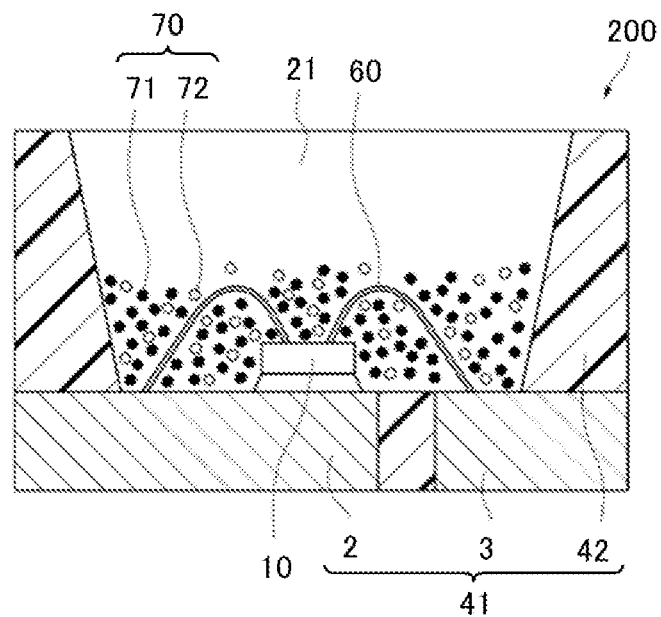
FIG. 6 is a schematic cross-sectional view illustrating an example of the light-emitting device of the first configuration example.

An example of the light-emitting device will be described on the basis of the drawings. FIGS. 5 and 6 are schematic cross-sectional views illustrating a light-emitting device of a first configuration example.

As illustrated in FIG. 5, a light-emitting device 100 includes a light-emitting element 10 having an emission peak wavelength in a range from 400 nm to 490 nm and a first phosphor 71 that emits light when excited by light from the light-emitting element.

The light-emitting device 100 includes a molded body 41, the light-emitting element 10, and a wavelength conversion member 21. The molded body 40 is formed by integrally molding a first lead 2, a second lead 3, and a resin portion 42 including a thermoplastic resin or a thermosetting resin. The molded body 41 forms a recessed portion including a bottom surface and lateral surfaces, and the light-emitting element 10 is mounted on the bottom surface of the recessed portion. The light-emitting element 10 includes a pair of positive and negative electrodes, and the pair of positive and negative electrodes are electrically connected to the first lead 2 and the second lead 3, respectively, via wires 60. The light-emitting element 10 is covered with the wavelength conversion member 21. The wavelength conversion member 21 includes, for example, phosphors 70 that convert the wavelength of the light from the light-emitting element 10 and a light-transmissive material. The wavelength conversion member 21 also functions as a sealing member that covers the light-emitting element 10 and the phosphors 70 in the recessed portion of the molded body 40. The phosphors 70 include the first phosphor 71 having an emission peak wavelength within a range from 570 nm to 680 nm when excited by light from the light-emitting element. The first lead 2 and the second lead 3 connected to the pair of positive and negative electrodes of the light-emitting element 10 are partially exposed to the outside of a package forming the light-emitting device 100. The light-emitting device 100 can emit light by receiving power supplied from an external source via the first lead 2 and the second lead 3.

As illustrated in FIG. 6, a light-emitting device 200 is the same as the light-emitting device 100 illustrated in FIG. 5 except that the phosphors 70 further include a second phosphor 72 having an emission peak wavelength within a range from 480 nm to less than 570 nm, and like members are denoted by similar reference signs.

A wavelength conversion member in a light-emitting device of the first configuration example preferably includes phosphors and a light-transmissive material. Examples of the light-transmissive material include at least one selected from the group consisting of a resin, glass, and an inorganic material. The resin is preferably at least one selected from the group consisting of an epoxy resin, a silicone resin, a phenol resin, and a polyimide resin. The inorganic material may be at least one selected from the group consisting of aluminum oxide and aluminum nitride. The wavelength conversion member may include, in addition to the phosphors and the light-transmissive material, a filler, a coloring agent, and a light diffusing material as necessary. Examples of the filler include silicon dioxide, barium titanate, titanium oxide, and aluminum oxide. The content of the components other than the phosphors and the light-transmissive material included in the wavelength conversion member can be within a range from 0.01 parts by mass to 50 parts by mass, and may be within a range from 0.1 parts by mass to 45 parts by mass, or within a range from 0.5 parts by mass to 40 parts by mass relative to 100 parts by mass of the light-transmissive material, in terms of the total content of the other components.

Method for Manufacturing Light-Emitting Device of First Configuration Example A method for manufacturing the light-emitting device of the first configuration example will now be described. For the details, the disclosure of JP 2010-62272 A may be referred to, for example. The method for manufacturing a light-emitting device preferably includes preparing a molded body, disposing a light-emitting element, disposing a composition for a wavelength conversion member, and forming a resin package. In a case in which a collective molded body including a plurality of recessed portions is used as the molded body, singulating may be included after forming the resin package to separate the resin package into respective unit regions.

In preparing the molded body, a plurality of leads are integrally molded using a thermosetting resin or a thermoplastic resin to prepare a molded body including a recessed portion including lateral surfaces and a bottom surface. The molded body may be formed from a collective base including a plurality of recessed portions. In disposing the light-emitting element, the light-emitting element is disposed on the bottom surface of the recessed portion of the molded body, and the positive and negative electrodes of the light-emitting element are connected to the first lead and the second lead via wires.

In disposing the composition for a wavelength conversion member, the composition for a wavelength conversion member is disposed in the recessed portion of the molded body.

In forming the resin package, the composition for a wavelength conversion member disposed in the recessed portion of the molded body is cured to form a resin package, and thus a light-emitting device is manufactured. In a case in which a molded body formed from a collective base including a plurality of recessed portions is used, after forming the resin package, in the singulation, the collective base including a plurality of recessed portions is separated into the unit regions of the resin packages, and individual light-emitting devices are manufactured. In this manner, the light-emitting device of the first configuration example illustrated in FIG. 5 or 6 can be manufactured.

Figure 7:
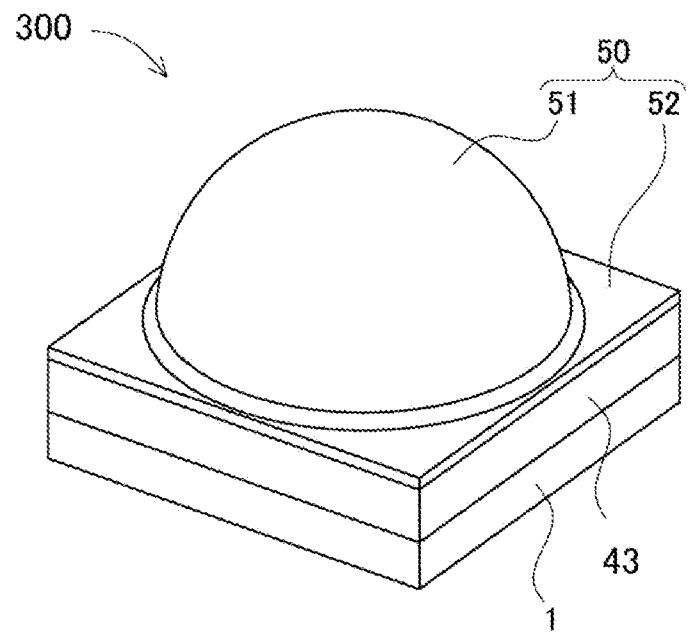
FIG. 7 is a schematic perspective view illustrating an example of a light-emitting device of a second configuration example.
Figure 8:
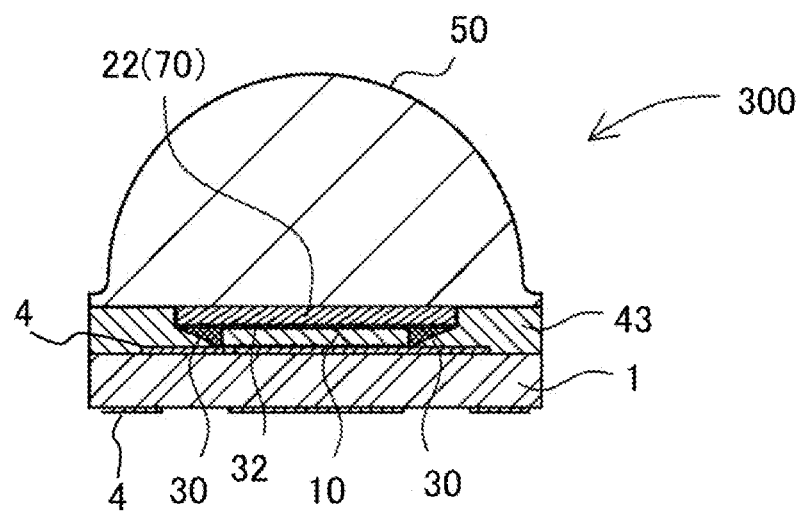
FIG. 8 is a schematic cross-sectional view illustrating an example of the light-emitting device of the second configuration example.

FIG. 7 is a schematic perspective view illustrating a light-emitting device of a second configuration example. FIG. 8 is a schematic cross-sectional view illustrating the light-emitting device of the second configuration example.

As illustrated in FIGS. 7 and 8, a light-emitting device 300 includes a support 1, the light-emitting element 10 disposed on the support 1, a wavelength conversion member 22 including the phosphors 70 disposed on the upper surface of the light-emitting element 10, and a light reflecting member 43 disposed on the support 1 at the side where the wavelength conversion member 22 and the light-emitting element 10 are located. A sealing member 50 is provided on the upper surface of the wavelength conversion member 22. The sealing member 50 includes a lens portion 51 having a circular shape in a plan view and a semi-spherical shape in a cross-sectional view and a flange portion 52 extending to the outer peripheral side of the lens portion 51. The lens portion 51 has a circular shape in a plan view and a semi-spherical shape in a cross-sectional view. Also, the flange portion 52 extends to the outer peripheral side of the lens portion 51.

The wavelength conversion member 22 is formed larger than the light-emitting element 10 in a plan view. In addition, a first light-transmissive member 30 that comes into contact with the lateral surface of the light-emitting element 10 and a portion of the wavelength conversion member 22 is provided between the lateral surface of the light-emitting element 10 and the light reflecting member 43. The first light-transmissive member 30 includes a light-transmissive bonding member 32 provided between the light-emitting element 10 and the wavelength conversion member 22. The light-transmissive bonding member 32 may be an adhesive that bonds together the light-emitting element 10 and the wavelength conversion member 22. A portion of the light-transmissive bonding member 32 may extend to a corner portion formed by the lateral surface of the light-emitting element 10 and the main surface of the wavelength conversion member 22 on the light-emitting element 10 side. As illustrated in FIG. 8, the cross-sectional shape of the extended light-transmissive bonding member 32 can be an inverted triangle expanding in the direction of the light reflecting memberb 43. The first light-transmissive member 30 and the bonding member 32 can be made of a resin with light transmissivity. The support 1 is a member for mounting the light-emitting element 10, the sealing member 50, and the like on the upper surface of the support 1. The support 1 includes a base material with insulating properties and a conductive member 4 such as a wiring pattern for mounting a light-emitting element on the surface of the base material.

The light reflecting member 43 is a member for covering the first light-transmissive member 30, the bonding member 32, and the wavelength conversion member 22. For the details of the light-emitting device of the second configuration example and the method for manufacturing the light-emitting device of the second configuration example described below, the disclosure of JP 2020-57756 A can be referred to, for example.

As with the wavelength conversion member of the light-emitting device of the first configuration example, the wavelength conversion member of the light-emitting device of the second configuration example may be a solitary phosphor layer including phosphors and a light-transmissive material. The phosphors include a first phosphor having an emission peak wavelength within a range from 570 nm to 680 nm when excited by light from the light-emitting element. The phosphors may include a second phosphor having an emission peak wavelength within a range from 480 nm to less than 570 nm when excited by light from the light-emitting element. As the light-transmissive material, the same light-transmissive material as that used in the wavelength conversion member of the light-emitting device of the first configuration example can be used. In addition to the phosphors and the light-transmissive material, the wavelength conversion member of the light-emitting device of the second configuration example may include a filler, a coloring agent, and a light diffusing material as necessary as with the wavelength conversion member of the light-emitting device of the first configuration example. When the wavelength conversion member is a solitary phosphor layer including phosphors and a light-transmissive material, a composition for a phosphor layer including phosphors and a light-transmissive material is cured to form a plate-like, sheet-like, or layer-like shape in advance and then singulated at a size that allows it to be disposed on the light-emitting element to form a plate-like, sheet-like, or layer-like wavelength conversion member.

Figure 9:
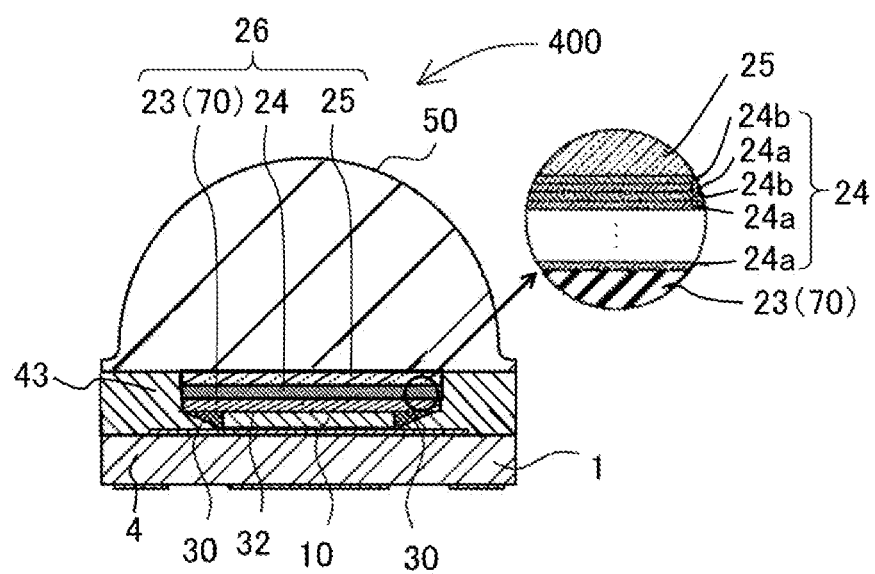
FIG. 9 is a schematic cross-sectional view illustrating another example of the light-emitting device of the second configuration example.

FIG. 9 is a schematic cross-sectional view illustrating the light-emitting device of another example of the second configuration example and a partially enlarged view of the schematic cross-sectional view of a phosphor layer, a band-pass filter layer, and a second light-transmissive member. The light-emitting device in FIG. 9 is different from the light-emitting device illustrated in FIG. 8 in that, as the wavelength conversion member, a wavelength conversion member including a phosphor layer including phosphors, a band-pass filter layer, and a second light-transmissive member is used, but is similar to the light-emitting device illustrated in FIG. 8 in terms of the other members of the light-emitting device.

The light-emitting device includes, on the light emission side of the light-emitting elements, a wavelength conversion member including a phosphor layer including a first phosphor and a band-pass filter layer disposed on the light emission side of the phosphor layer. Also, the band-pass filter layer preferably has an average reflectivity of light with a wavelength range from 380 nm to less than 495 nm, for example, light with a wavelength range from 380 nm to 494 nm, of 80% or greater and has an average reflectivity of light with a wavelength range from greater than 580 nm to 780 nm, for example, light with a wavelength range from 581 nm to 780 nm, of 20% or less, with respect to light with an angle of incidence within a range from 0 degrees to 30 degrees. Since the light-emitting device includes the wavelength conversion member including the band-pass filter layer described above, light can be emitted that has reduced light on the short wavelength side that sea turtles are sensitive to and are attracted to. The band-pass filter layer more preferably has an average reflectivity of light with a wavelength range from 380 nm to less than 495 nm of 80% or greater and has an average reflectivity of light with a wavelength range from 525 nm to 780 nm of 20% or less, with respect to light with an angle of incidence within a range from 0 degrees to 30 degrees. The band-pass filter layer even more preferably has an average reflectivity of light with a wavelength range from 380 nm to less than 495 nm of 80% or greater and has an average reflectivity of light with a wavelength range from 500 nm to 780 nm of 20% or less, with respect to light with an angle of incidence within a range from 0 degrees to 30 degrees.

The proportion of a spectral radiance $S_a(\lambda)$ of the light emission in a specific wavelength range of the light-emitting device after the dielectric multilayer film, that is, the band-pass filter layer, is disposed with respect to a spectral radiance $S_b(\lambda)$ in a specific wavelength range of the light-emitting device before the dielectric multilayer film, that is, the band-pass filter layer, is disposed being 100%, can be measured as the retention ratio of the spectral components of the light-emitting device including the band-pass filter layer. An example of the specific wavelength range includes a range from 300 nm to 800 nm, for example. The retention ratio of the spectral components within a range from 300 nm to 800 nm of the light-emitting device including the band-pass filter layer can be calculated using the following Equation (5). The retention ratio of the spectral components within a range from 300 nm to 800 nm of the light-emitting device including the band-pass filter layer is preferably 40% or greater, more preferably 50% or greater, even more preferably 60% or greater, yet even more preferably 70% or greater, and particularly preferably 80% or greater. When the retention ratio of the spectral components of the light-emitting device including the band-pass filter layer is less than 40%, for example, when the retention ratio of the spectral components of the light-emitting device including the band-pass filter layer is 39% or less, a portion of the light of the emission spectrum of the color of the light emitted from the light-emitting device may be weakened and there is a possibility of the color of the emitted light causing discomfort in humans. Also, when the retention ratio of the spectral components of the light-emitting device including the band-pass filter layer is less than 40%, a large amount of light is reflected at the band-pass filter layer and there is a possibility that the component of light wavelength-converted by the phosphors is reduced and the luminance is reduced. The retention ratio of the spectral components of the light-emitting device including the band-pass filter layer may be 100% or less, 95% or less, 92% or less, or 91% or less.

[Math. 6]

$$\text{Spectral component retention ratio (\%)} = \frac{\int_{300}^{800} S_a(\lambda)d\lambda}{\int_{300}^{800} S_b(\lambda)d\lambda} \times 100 \quad (5)$$

A light-emitting device 400 includes a wavelength conversion member 26 including a phosphor layer 23 including the phosphors 70 and a band-pass filter layer 24. The wavelength conversion member 26 may include a second light-transmissive member 25 and may be a multilayer body including the phosphor layer 23, the band-pass filter layer 24, and the second light-transmissive member 25 layered in this order from the light emission side of the light-emitting elements. The phosphors 70 included in the phosphor layer 23 include the first phosphor and may include the second phosphor. The phosphor layer 23, the band-pass filter layer 24, and the second light-transmissive member 25 may be formed in a plate-like, sheet-like, or layer-like shape larger than the light-emitting element 10 in a plan view, and the phosphor layer 23, the band-pass filter layer 24, and the second light-transmissive member 25 are layered in this order from the side of the light-emitting element 10 to form the wavelength conversion member 26.

The band-pass filter layer 24 is preferably made from a dielectric multilayer film. The dielectric multilayer film can be constituted by a multilayer film including, for example, a first dielectric layer 24a and a second dielectric layer 24b with different refractive indices alternately layered. By setting the emission spectrum of the light emitted by the light-emitting element 10 and the film thickness of the first dielectric layer 24a and the film thickness of the second dielectric layer 24b on the basis of a first refractive index of the first dielectric layer 24a and a second refractive index of the second dielectric layer 24b, the band-pass filter layer 24 can be formed so that, for light within an angle of incidence ranging from 0 degrees to 30 degrees, light within a wavelength range of from 380 nm to less than 495 nm is reflected and light with an emission peak wavelength within a range of from 570 nm to 680 nm emitted by the phosphors included in the phosphor layer 23 is transmitted. The band-pass filter layer 24 made of a dielectric multilayer film includes the two first dielectric layer 24a and the second dielectric layer 24b with different refractive indices formed alternating in cycles at a film thickness of $\lambda/4$. $\lambda$ is the peak wavelength of the wavelength region to be reflected and is the wavelength in the medium of each dielectric material. For the band-pass filter layer 24, the refractive indices, the difference in refractive indices, and the number of alternately formed cycles of the first dielectric layer 24a made of a dielectric material with a low refractive index and the second dielectric layer 24b made of a dielectric material with a high refractive index are set as appropriate to stably obtain the desired average reflectivity within the desired wavelength range.

The refractive index (first refractive index) of the first dielectric layer with a low refractive index can be set within a range from 1.0 to 1.8, for example, and can be preferably set within a range from 1.2 to 1.6. The first dielectric layer, for example, can be formed of $SiO_2$ (with a refractive index of 1.5, for example). The refractive index (second refractive index) of the second dielectric layer with a high refractive index can be set within a range from 1.5 to 3.0, for example, and can be preferably set within a range from 2.0 to 2.6. The second dielectric layer, for example, can be formed of $Nb_2O_5$ (with a refractive index of 2.4, for example). The number of cycles alternately formed by the first dielectric layer and the second dielectric layer can be set within a range from 1 to 30, for example, and can be preferably set within a range from 1 to 25.

The dielectric material forming the first dielectric layer can be selected from $SiO_2$, $Al_2O_3$, and SiON, for example. The dielectric material forming the second dielectric layer can be selected from $TiO_2$, $Nb_2O_3$, $Ta_2O_5$, and $Zr_2O_5$, for example.

For the phosphor layer, a wavelength conversion member made of a solitary phosphor layer, or a similar phosphor layer can be used. For the light-transmissive member, a member made of glass or resin can be used. The glass can be selected from borosilicate glass or quartz glass, for example. Also, the resin can be selected from silicone resin and epoxy resin, for example.

The wavelength conversion member including the phosphor layer, the band-pass filter layer, and the second light-transmissive member can be formed as follows, for example. First, a plate-like second light-transmissive member is prepared. Subsequently, a band-pass filter layer made of a dielectric multilayer film including a first dielectric layer and a second dielectric layer with different refractive indices alternately layered is formed. The dielectric multilayer film can be formed by alternately depositing the first dielectric layer and the second dielectric layer via Atomic Layer Deposition (ALD), sputtering, vapor deposition, or the like. Subsequently, a phosphor layer is formed on the band-pass filter layer. The phosphor layer can be formed on the band-pass filter layer using a printing method, for example. In the printing method, a composition for a phosphor layer including phosphors, a binder, and a solvent as necessary is prepared and the composition for a phosphor layer is applied to the surface of the band-pass filter layer made of a dielectric multilayer film and dried to form a phosphor layer. For the binder, an organic binder such as an epoxy resin, a silicone resin, a phenol resin, or a polyimide resin and an inorganic binder such as glass can be used. The phosphor layer can be formed by a compression molding method, a phosphor electrodeposition method, a phosphor sheet method, or the like instead of the printing method.

Method for Manufacturing Light-Emitting Device of Second Configuration Example

An example of a method for manufacturing the light-emitting device of the second configuration example will now be described. The method for manufacturing the light-emitting device of the second configuration example includes disposing the light-emitting element, preparing the wavelength conversion member, forming the light-transmissive member and the bonding member, disposing the light reflecting member, and disposing the sealing member, and may further include singulating for separating into unit regions.

In disposing the light-emitting element, the light-emitting element is flip-chip mounted on a support prepared in advance. In preparing the wavelength conversion member, a plate-like, sheet-like, or layer-like wavelength conversion member formed in advance via the method described above is singulated at a size that allows it to be disposed on the light-emitting element to prepare a plate-like, sheet-like, or layer-like wavelength conversion member. In forming the first light-transmissive member and the bonding member, an adhesive with light transmissivity is applied onto the upper surface of the light-emitting element, and the wavelength conversion member is bonded to the upper surface of the light-emitting element. The adhesive protruding from the interface between the light-emitting element and the wavelength conversion member extends and adheres from the lateral surface of the light-emitting element to the periphery of the wavelength conversion member, forms a fillet shape, and is cured to form the first light-transmissive member and the bonding member. In disposing the light reflecting member, a white resin is disposed and cured on the upper surface of the support so as to cover the lateral surfaces of the wavelength conversion member and the light-transmissive member, thus disposing the light reflecting member. Finally, the sealing member is disposed on the upper surfaces of the wavelength conversion member and the light reflecting member. In this manner, the light-emitting device of the second configuration example can be manufactured.

Lighting Appliance or Street Light

It is sufficient that the lighting appliance includes at least one of the light-emitting devices described above. The lighting appliance includes the above-described light-emitting device and may further include a reflecting member, a protective member, an accessory device for supplying power to the light-emitting device, and the like. The lighting appliance may also include a plurality of light-emitting devices. In a case in which the lighting appliance includes a plurality of light-emitting devices, the lighting appliance may include a plurality of the same light-emitting devices or a plurality of light-emitting devices having different forms. In addition, a drive device that can individually drive the plurality of light-emitting devices and adjust the brightness or the like of each light-emitting device may be provided. The lighting appliance may be any of a direct attaching-type, an embedding-type, a pendant-type, or the like. The lighting appliance may be a lighting appliance such as a street light expected to be installed outdoors at a harbor or in a tunnel, may be a lighting appliance such as a headlight, flashlight, or portable lantern using LEDs expected to be used outdoors, or may be a lighting appliance installed indoors but at a place near the outdoors such as by a window.

Figure 10:
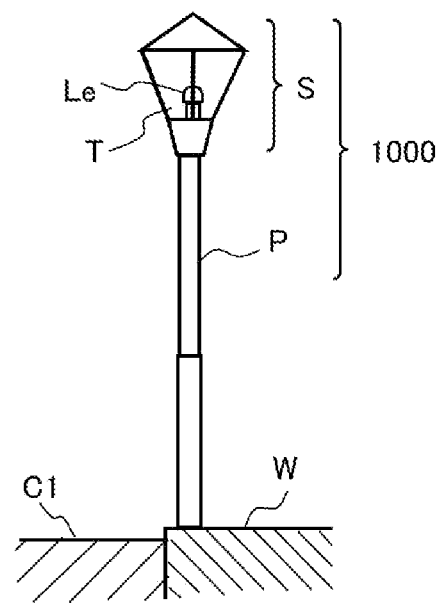
FIG. 10 is a schematic diagram illustrating an example of a street light.

It is sufficient that the street light includes at least one of the light-emitting devices described above. FIG. 10 is a schematic diagram illustrating an example of a street light 1000. The street light 1000 includes a pole P installed on a sidewalk W or a roadway C1 and a support portion S of a light-emitting device Le, and the support portion S includes a light transmitting portion T which covers the periphery of the light-emitting device Le and transmits at least part of the light emitted by the light-emitting device Le, the light transmitting portion being made of acrylic, polycarbonate, glass, or the like. The street light 1000 can illuminate a low place from a high place via the light-emitting device Le installed on the support portion S integrated with the pole P. The street light may be a pole-type street light provided with a pole that allows the height of the support portion to be set discretionarily, may be a bracket-type street light in which the support portion is supported with a bracket instead of a pole, may be a floodlight-type street light that illuminates upward from below, and may be a landscape material-embedded-type street light that is incorporated into a landscape material such as a pillar or a block.

Figure 11:
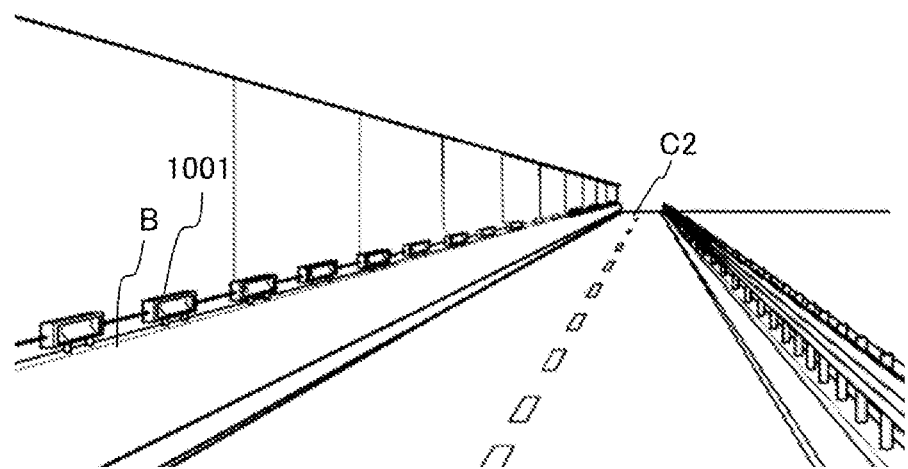
FIG. 11 is a schematic diagram illustrating an example installation of a low-position lighting device, which is an example of a street light.

The street light may be a low-position lighting device that illuminates the road surface or beach from a low position. It is sufficient that the low-position lighting device includes at least one of the light-emitting devices described above. By using the light-emitting device described above as a low-position lighting device, light with a relaxing warmth can be emitted. FIG. 11 is a schematic diagram illustrating an example of a low-position lighting device 1001. The low-position lighting device 1001 may be installed on a placement platform B provided on a side portion of a road C2, for example. The low-position lighting device can be installed at a position lower than the eye level of drivers in vehicles driving on the roadway, for example. The low-position lighting device may be installed at a height ranging from approximately 1 m to 1.2 m from the road surface of the roadway. The low-position lighting device may be installed at a place for lighting the side portion of a sidewalk of a flower bed or park or for lighting a beach instead of on the side portion of the road.

EXAMPLES

The present invention will be described in detail hereinafter using examples. However, the present invention is not limited to these examples.

In the light-emitting devices of the examples and the comparative examples, the following first phosphor and/or second phosphor was used.

First Phosphor

As the first phosphor, first nitride phosphors BSESN-2 and BSESN-3 included in the composition represented by Formula (1A), second nitride phosphors SCASN-1, SCASN-2, SCASN-3, SCASN-4, and SCASN-6 included in the composition represented by Formula (1B), and fluoride phosphor KSF included in the composition represented by Formula (1C) were prepared. These phosphors are the first nitride phosphor or the second nitride phosphor included in the composition represented by Formula (1A) or Formula (1B), but the molar ratio of the elements included in the composition is different and the emission peak wavelength and the full width at half maximum are different, as illustrated in Table 1.

Second Phosphor

As the second phosphor, rare earth aluminate phosphors G-YAG1 and G-YAG4 included in the composition represented by Formula (2A) with the composition $Y_3(Al,Ga)_5O_{12}$:Ce (a satisfies $0<a\leq0.5$) and rare earth aluminate phosphors YAG1 and YAG3 included in the composition represented by Formula (2A) with the composition $Y_3Al_5O_{12}$:Ce were prepared. These phosphors are the rare earth aluminate phosphors included in the composition represented by Formula (2A), but the molar ratio of the elements included in the composition is different and the emission peak wavelength and the full width at half maximum are different, as illustrated in Table 2.

Measurement of Emission Spectrum of Phosphor

Using a quantum efficiency measurement device (QE-2000 manufactured by Otsuka Electronics Co., Ltd.), each phosphor was irradiated with light having an excitation wavelength of 450 nm, the emission spectrum at room temperature (approximately 25° C.) was measured, and the emission peak wavelength and the full width at half maximum were measured from the emission spectrum. The results are listed in Tables 1 and 2.

TABLE 1

|  | Peak wavelength (nm) | Half badnwidth (nm) |
| --- | --- | --- |
| SCASN 1 | 608 | 73.5 |
| SCASN 2 | 612 | 74.6 |
| SCASN 3 | 620 | 72.9 |
| SCASN 4 | 628 | 75.4 |
| SCASN 6 | 642 | 96.4 |
| BSESN 2 | 586 | 74.2 |
| BSESN 3 | 594 | 80.6 |
| KSF | 631 | 7.2 |

TABLE 2

|  | Peak wavelength (nm) | Half badnwidth (nm) |
| --- | --- | --- |
| G-YAG1 | 539 | 108.8 |
| G-YAG4 | 557 | 111.7 |
| YAG1 | 548 | 111.2 |
| YAG3 | 565 | 118.9 |

Band-Pass Filter Layer

A band-pass filter layer including the dielectric multilayer film-1 (DBR-1), the dielectric multilayer film-2 (DBR-2), and the dielectric multilayer film-3 (DBR-3) used in the Examples can be used.

Measurement of Reflectance Spectrum of Dielectric Multilayer Film

Figure 12:
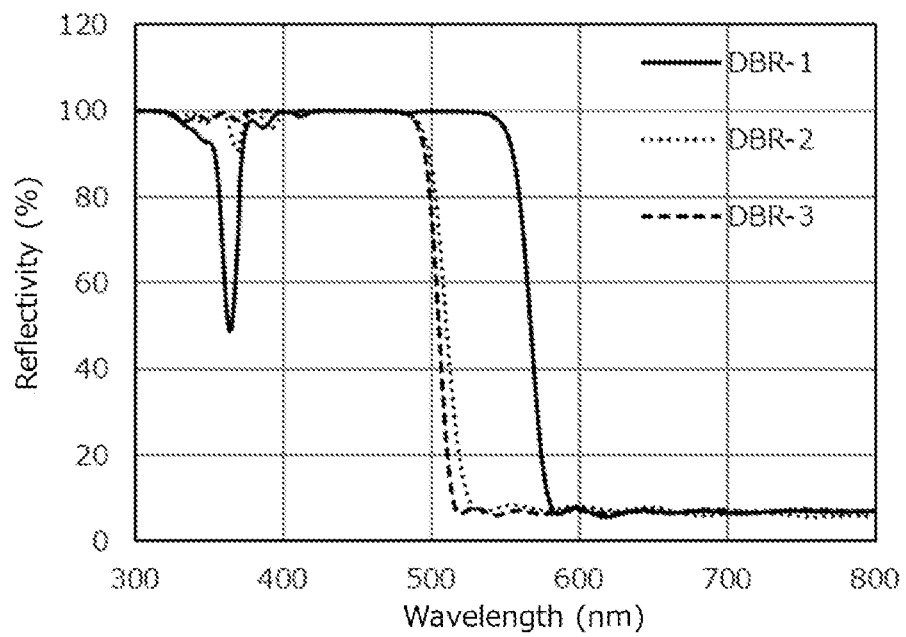
FIG. 12 is a diagram illustrating a reflectance spectrum of the dielectric multilayer film-1 (DBR-1), the dielectric multilayer film-2 (DBR-2), and the dielectric multilayer film-3 (DBR-3) at an angle of incidence of 0 degrees.

For each of the dielectric multilayer films, light was irradiated by an excitation light source from a normal direction (0-degree angle of incidence) of the dielectric multilayer film and a spectrophotometer (V-670, available from JASCO corporation) was used to measure the reflectance spectrum in a wavelength range from 300 nm to 800 nm at room temperature (25° C.+5° C.). The reflectance spectra of the dielectric multilayer film-1 (DBR-1), the dielectric multilayer film-2 (DBR-2), and the dielectric multilayer film-3 (DBR-3) were measured. The reflectance spectrum of the dielectric multilayer film-1 (DBR-1), the dielectric multilayer film-2 (DBR-2), and the dielectric multilayer film-3 (DBR-3) are illustrated in FIG. 12. In the reflectance spectra of the dielectric layers with an angle of incidence of 0 degrees, the maximum reflection intensity in a wavelength range from 380 nm to 780 nm is set to 100%. With respect to light with an angle of incidence of 0 degrees, the average reflectivity of light within a wavelength range from 380 nm to less than 495 nm, the average reflectivity of light within a wavelength range from greater than 580 nm to 780 nm, the average reflectivity of light within a wavelength range from 525 nm to 780 nm, and the average reflectivity of light within a wavelength range from 500 nm to 780 nm are listed in Table 3.

TABLE 3

|  | Average reflectivity (%) | | | |
| --- | --- | --- | --- | --- |
|  | From 380 nm to less than 495 nm | From 500 nm to 780 nm | From 525 nm to 780 nm | From greater than 580 nm to 780 nm |
| DBR-1 | 99.4 | 28.8 | 21.8 | 6.8 |
| DBR-2 | 99.3 | 10.6 | 7.1 | 6.9 |
| DBR-3 | 99.6 | 8.7 | 6.8 | 6.8 |

For the dielectric multilayer film-1 (DBR-1), the average reflectivity of light within a wavelength range from 380 nm to less than 495 nm was 80% or greater, and the average reflectivity of light within a wavelength range from greater than 580 nm to 780 nm was 20% or less. For the dielectric multilayer film-1 (DBR-1), the dielectric multilayer film-2 (DBR-2), and the dielectric multilayer film-3 (DBR-3), the light within a wavelength range from 380 nm to less than 495 nm is light within a wavelength range from 380 nm to 494 nm, for example. Also, the light within a wavelength range from greater than 580 nm to 780 nm is light within a wavelength range from 581 nm to 780 nm, for example. For the dielectric multilayer film-2 (DBR-2), the average reflectivity of light within a wavelength range from 380 nm to less than 495 nm was 80% or greater, and the average reflectivity of light within a wavelength range from 525 nm to 780 nm was 20% or less.

For the dielectric multilayer film-3 (DBR-3), the average reflectivity of light within a wavelength range from 380 nm to less than 495 nm was 80% or greater, and the average reflectivity of light within a wavelength range from 500 nm to 780 nm was 20% or less.

Examples 1 and 2

The light-emitting device of the first configuration example was manufactured. FIG. 6 can be referred to for the light-emitting device of the first configuration example. The light-emitting element 10 used included nitride-based semiconductor layers with an emission peak wavelength of 450 nm. The size of the light-emitting element 10 corresponds to a roughly square planar shape of approximately 700 mm square and a thickness of approximately 200 mm.

A lead frame was used as the first lead 2 and the second lead 3, and the first lead 2 and the second lead 3 were integrally molded using an epoxy resin to prepare the molded body 41 including the recessed portion with the lateral surfaces and the bottom surface. The light-emitting element 10 was disposed on the bottom surface of the recessed portion of the molded body 41, and the positive and negative electrodes of the light-emitting element 10 were connected to the first lead 2 and the second lead 3 via the wires 60 made of Au.

A silicone resin was used as the light-transmissive material forming the wavelength conversion member 21. In the composition for a wavelength conversion member, in order to obtain a correlated color temperature at or near 1850 K, that is, in a range from 1800 K to 1950 K, for a mixed color light of light emitted from the light-emitting element 10 and light emitted from the phosphors 70 including the first phosphor 71 and the second phosphor 72, the first phosphor 71 and the second phosphor were blended. The total amount of the phosphors 70 relative to 100 parts by mass of the light-transmissive material and the blending ratio for the first phosphors 71 and the second phosphor 72 are as listed in Table 4. In the composition for a wavelength conversion member, 2 parts by mass of the aluminum oxide was also blended as a filler relative to 100 parts by mass of the silicone resin. Subsequently, the prepared composition for a wavelength conversion member was inserted into the recessed portion of the molded body 41.

The composition for a wavelength conversion member inserted into the recessed portion of the molded body 41 was heated at 150° C. for 3 hours and cured to form a resin package including the wavelength conversion member 21 including the first phosphor 71 and the second phosphor 72. Thus, the light-emitting device 200 of the first configuration example that emits light having a correlated color temperature of 1950 K or less was manufactured.

Example 3

The light-emitting device of the first configuration example was manufactured. The light-emitting device of the first configuration example includes only the first phosphor but not the second phosphor as illustrated in FIG. 5.

The resin package was formed and the light-emitting device 100 of the first configuration example that emits light having a correlated color temperature of 1950 K or less was manufactured in the same manner as in Example 1, except that the first phosphor 71 was 100 mass % of the total amount (total amount of the first phosphor 71) of the phosphors 70 and the total amount of the first phosphor 71 and the second phosphor using the first phosphor 71 listed for each example in Table 4 as the composition for a wavelength conversion member. As listed in Table 4, as the first phosphor, two different types of the first nitride phosphor, BSESN2 and BSESN3, having the composition represented by Formula (1A) were used, and the mass ratio (BSESN2/BSESN3) of BSESN2 and BSESN3 was 30/70.

Example 4

The light-emitting device 200 of the first configuration example was manufactured. The light-emitting device 200 of the first configuration example includes the first phosphor 71 and the second phosphor 72 as illustrated in FIG. 6.

A phenyl silicone resin was used as the light-transmissive material forming the wavelength conversion member 21. The phosphors listed in Table 4 were used as the first phosphor 71 and the second phosphor 72.

In the composition for a wavelength conversion member, in order to obtain a correlated color temperature at or near 1850 K, that is, in a range from 1800 K to 1950 K, for a mixed color light of light emitted from the light-emitting element 10 and light emitted from the phosphors 70 including the first phosphor 71, the first phosphor 71 and the second phosphor 72 were blended. The total amount of the phosphors 70 relative to 100 parts by mass of the light-transmissive material and the blending ratio for the first phosphor 71 and the second phosphor 72 are as listed in Table 4. In the composition for a wavelength conversion member, 15 parts by mass of the silicon dioxide was blended as a filler relative to 100 parts by mass of the phenyl silicone resin. Subsequently, the prepared composition for a wavelength conversion member was inserted into the recessed portion of the molded body 41.

The composition for a wavelength conversion member inserted into the recessed portion of the molded body 41 was heated at 150° C. for 4 hours and cured to form a resin package including the wavelength conversion member 21 including the first phosphor 71 and the second phosphor 72. Thus, the light-emitting device 200 of the first configuration example that emits light having a correlated color temperature of 1950 K or less was manufactured.

Examples 5 and 6

Figure 13:
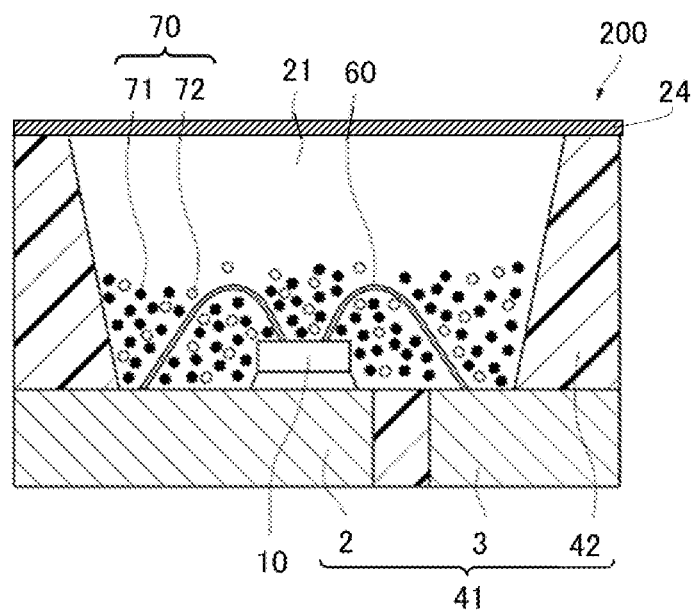
FIG. 13 is a schematic cross-sectional view illustrating an example of the light-emitting device of the first configuration example provided with a band-pass filter layer.

The light-emitting device of the first configuration example is manufactured as in Example 1, and the dielectric multilayer film is disposed, as the band-pass filter layer 24, on the light emission side of the wavelength conversion member 21 of the light-emitting device 100 as illustrated in FIG. 13. In Example 5, a dielectric multilayer film 2 (DBR-2) is disposed on the light emission side of the wavelength conversion member of the light-emitting device as in Example 1. In Example 6, a dielectric multilayer film 3 (DBR-3) is disposed on the light emission side of the wavelength conversion member of the light-emitting device as in Example 1.

Examples 7 and 8

In Example 7, the dielectric multilayer film 2 (DBR-2) is disposed on the light emission side of the wavelength conversion member of the light-emitting device as in Example 2. In Example 8, the dielectric multilayer film 3 (DBR-3) is disposed on the light emission side of the wavelength conversion member of the light-emitting device as in Example 2.

Examples 9 and 10

In Example 9, the dielectric multilayer film 2 (DBR-2) is disposed on the light emission side of the wavelength conversion member of the light-emitting device as in Example 3. In Example 10, the dielectric multilayer film 3 (DBR-3) is disposed on the light emission side of the wavelength conversion member of the light-emitting device as in Example 3.

Examples 11 and 12

In Example 11, the dielectric multilayer film 2 (DBR-2) is disposed on the light emission side of the wavelength conversion member of the light-emitting device as in Example 4. In Example 12, the dielectric multilayer film 3 (DBR-3) is disposed on the light emission side of the wavelength conversion member of the light-emitting device as in Example 4.

Comparative Example 1

The light-emitting device of the second configuration example was manufactured.

FIGS. 7 and 8 can be referred to for the light-emitting device of the second configuration example.

Disposing of Light-Emitting Element

A ceramic substrate including aluminum nitride as a material was used as the support 1. The light-emitting element 10 used included nitride-based semiconductor layers with an emission peak wavelength of 450 nm. The size of the light-emitting element 10 corresponds to a roughly square planar shape of approximately 1.0 mm square and a thickness of approximately 0.11 mm. The light-emitting element was disposed with the light emission surface on the sealing member side and flip-chip mounted via a bump using the conductive member 4 made of Au.

Preparing of Wavelength Conversion Member

A silicone resin was used as the light-transmissive material forming the wavelength conversion member 22. In the composition for a wavelength conversion member, in order to obtain a correlated color temperature at or near 2230 K, that is, near the color temperature of a sodium lamp, for a mixed color light of light emitted from the light-emitting element 10 and light emitted from the phosphors 70 including the first phosphor and the second phosphor, the first phosphor 71 and the second phosphor 72 were blended. The total amount of the phosphors 70 relative to 100 parts by mass of the light-transmissive material and the blending ratio for the first phosphors and the second phosphor are as listed in Table 4. In the composition for a wavelength conversion member, 2 parts by mass of the aluminum oxide was blended as a filler relative to 100 parts by mass of the silicone resin. Subsequently, the prepared composition for a wavelength conversion member was heated at 180° C. for 2 hours and cured into a sheet-like shape. Then, the singulated sheet-like wavelength conversion member 22 was prepared having a roughly square planar shape of approximately 1.6 mm squared and a thickness of approximately 150 μm, which is approximately 0.1 mm larger in length and width than the planar shape of the light-emitting element 10.

Forming of Light-Transmissive Member and Bonding Member A phenyl silicone resin, which is an adhesive with light transmissivity, was applied onto the upper surface of the light-emitting element 10 to bond the wavelength conversion member 22 thereon, the adhesive with light transmissivity was further applied to the interface between the light-emitting element 10 and the wavelength conversion member 22, and then cured at 150° C. for 4 hours to form the first light-transmissive member 30 and the bonding member 32, which were cured in a fillet shape extending from the lateral surface of the light-emitting element 10 to the periphery of the wavelength conversion member 22.

Disposing of Light Reflecting Member

A composition for a light reflecting member including a dimethyl silicone resin and titanium oxide particles having an average particle size (catalog value) of 0.28 μm in which the amount of the titanium oxide particles is 60 parts by mass relative to 100 parts by mass of the dimethyl silicone resin was prepared. The composition for a light reflecting member, which is a white resin, was disposed on the upper surface of the support 1 to cover the lateral surfaces of the wavelength conversion member 22 and the light-transmissive member 30 and then cured to form the light reflecting member 43.

Disposing of Sealing Member

Finally, the sealing member 50 including the lens portion 51 formed by curing phenyl silicone resin and having a circular shape in a plan view and a semi-spherical shape in a cross-sectional view and the flange portion 52 extending to the outer peripheral side of the lens portion 51 was disposed to manufacture the light-emitting device 300 of the second configuration example that emits light having a correlated color temperature of greater than 1950 K.

Comparative Examples 2 and 3

The light-emitting device of the first configuration example was manufactured. The light-emitting device of the first configuration example includes the first phosphor and the second phosphor.

As the composition for a wavelength conversion member, a composition for a wavelength conversion member including the first phosphors 71 and the second phosphor 72 was prepared with a correlated color temperature at or near 2000 K, that is, near the color temperature of a sodium lamp, for a mixed color light of light emitted from the light-emitting element 10 and light emitted from the phosphors 70 including the first phosphor 71 and the second phosphor 72. In the composition for a wavelength conversion member, the total amount of the phosphors 70 relative to 100 parts by mass of the light-transmissive material and the blending ratio for the first phosphor 71 and the second phosphor 72 are as listed in Table 4.

The composition for a wavelength conversion member was placed onto the light-emitting element 10 in the recessed portion of the molded body 41, injected into the recessed portion, and heated at 150° C. for 4 hours to cure the composition for a phosphor member and form a phosphor member 21. Thus, the light-emitting device 200 of the first configuration example that emits light having a correlated color temperature in a range from greater than 1950 K to 2000 K was manufactured.

The following measurements were performed for the light-emitting devices. The results are listed in Tables 4 to 7.

Emission Spectrum of Light-Emitting Device

For each light-emitting device, the emission spectrum was measured using an optical measurement system combining a spectrophotometer (PMA-12, Hamamatsu Photonics K.K.) and an integrating sphere. The emission spectrum of each light-emitting device was measured at room temperature (in a range from 20° C. to 30° C.). FIGS. 14 to 19 illustrate the emission spectrum (spectral radiance) $S(\lambda)$ of each light-emitting device when the luminance derived from the denominator in Equation (1) of each light-emitting device is set to the same value, the luminous efficiency function for human photopic vision $V(\lambda)$ specified by the CIE, and the sea turtle light response curve $R_t(\lambda)$. FIGS. 20 to 23 illustrate the emission spectrum of a light-emitting device without a band-pass filter layer and each light-emitting device with a band-pass filter layer.

Chromaticity Coordinates (x, y), Correlated Color Temperature (K), Color Deviation Duv, Average Color Rendering Index Ra, Special Color Rendering Index R9, and Full Width at Half Maximum From the emission spectrum of each light-emitting device, the chromaticity coordinates (x value, y value) on the CIE chromaticity diagram of CIE 1931, the correlated color temperature (CCT:K) and color deviation Duv according to JIS Z8725, the average color rendering index Ra according to JIS Z8726, the special color rendering index R9, and the full width at half maximum were measured.

Ratio Lp of Second Radiance to First Radiance

From the emission spectrum (spectral radiance) $S(\lambda)$ of each light-emitting device, the ratio Lp (%) of the second radiance in a range from 650 nm to 750 nm was calculated on the basis of Equation (2) when the first radiance in a range from 400 nm to 750 nm was 100%.

Sea Turtle Light Attraction Index T

The emission spectrum (spectral radiance) $S(\lambda)$ measured for each light-emitting device, the luminous efficiency function for human photopic vision $V(\lambda)$ specified by the CIE, and the sea turtle light response curve $R_t(\lambda)$ were substituted into Equation (1) and the sea turtle light attraction index T of each light-emitting device was measured on the basis of Equation (1). For the sea turtle light response curve $R_t(\lambda)$ and the luminous efficiency function for human photopic vision $V(\lambda)$, an action curve with the maximum sensitivity (sensitivity peak wavelength) set to 1 was used.

Relative Attraction Index Ratio $T/T_0$

The attraction index T of the light-emitting device of Comparative Example 3, which had the lowest numerical value for the attraction index T among the light-emitting devices of Comparative Examples 1 to 3 that emit light having a correlated color temperature of greater than 1950 K, was defined as the reference attraction index $T_0$ on the basis of Equation (3). The relative attraction index ratio $T/T_0$, which is the ratio of the attraction index of each light-emitting device to the reference attraction index $T_0$, was calculated on the basis of Equation (4).

Spectral Component Retention Ratio when Band-Pass Filter Layer is Provided

The proportion of the spectral radiance $S_a(\lambda)$ of the light emission in a wavelength range from 300 nm to 800 nm of the light-emitting device after the dielectric multilayer film, that is, the band-pass filter layer, is disposed with respect to the spectral radiance $S_b(\lambda)$ of the light emission in a wavelength range from 300 nm to 800 nm of the light-emitting device before the dielectric multilayer film, that is, the band-pass filter layer, is disposed being 100% can be calculated as the retention ratio of the spectral components when a band-pass filter layer is provided on the basis of Equation (5).

TABLE 4

| | Phosphor | | | | | | | | Full width at half maximum (nm) of emission peak | | |
|---|---|---|---|---|---|---|---|---|---|---|---|
| | | | Phosphor total amount | Blending ratio (mass %) | | Correlated color temperature | Color deviation | Average color rendering index | having maximum emission intensity | Attraction index | Relative attraction index |
| | First phosphor | Second phosphor | (parts by mass) | First phosphor | Second phosphor | CCT (K) | Duv | Ra | (nm) | T | T/T$_0$ (%) |
| Example 1 | SCASN 4 | G-YAG4 | 124.4 | 12.4 | 87.6 | 1792 | 0.000 | 72 | 86 | 0.371 | 89 |
| Example 2 | SCASN 1 | YAG3 | 104.7 | 53.1 | 46.9 | 1789 | 0.000 | 51 | 80 | 0.347 | 83 |
| Example 3 | BSESN 2/ BSESN 3 = 15/85 | — | 75.0 | 100.0 | — | 1796 | 0.000 | 30 | 73 | 0.330 | 70 |
| Example 4 | KSF | YAG3 | 84.3 | 86.9 | 13.1 | 1798 | 0.000 | 88 | 4 | 0.390 | 94 |
| Comparative Example 1 | SCASN 3 | YAG1 | 170.0 | 17.0 | 83.0 | 2231 | −0.002 | 70 | 95 | 0.496 | 119 |
| Comparative Example 2 | SCASN 6 | G-YAG1 | 120.0 | 16.3 | 83.7 | 1983 | 0.000 | 84 | 118 | 0.439 | 105 |
| Comparative Example 3 | SCASN 2 | G-YAG1 | 108.0 | 27.4 | 72.6 | 1995 | 0.000 | 61 | 80 | 0.417 | 100 |

TABLE 5

| | Chromaticiy coordinate | | Spcial color rendering index | Radiance ratio Lp (%) 650-750/ 400-750 |
|---|---|---|---|---|
| | x | y | R9 | |
| Example 1 | 0.549 | 0.408 | −22 | 22 |
| Example 2 | 0.549 | 0.408 | −81 | 17 |
| Example 3 | 0.549 | 0.409 | −131 | 15 |
| Example 4 | 0.549 | 0.409 | 94 | 9 |
| Comparative Example 1 | 0.503 | 0.418 | −36 | 17 |
| Comparative Example 2 | 0.528 | 0.413 | 27 | 31 |
| Comparative Example 3 | 0.527 | 0.413 | −65 | 15 |

TABLE 6

| | Phosphor | | | | | | |
|---|---|---|---|---|---|---|---|
| | | | Phosphor total amount | Blending ratio (mass %) | | Band-pass filter layer | Correlated color temperature |
| | First phosphor | Second phosphor | (parts by mass) | First phosphor | Second phosphor | | CCT (K) |
| Example 5 | SCASN 4 | G-YAG4 | 124.4 | 12.4 | 87.6 | DBR-2 | 1732 |
| Example 6 | SCASN 4 | G-YAG4 | 124.4 | 12.4 | 87.6 | DBR-3 | 1751 |
| Example 7 | SCASN 1 | YAG3 | 104.7 | 53.1 | 46.9 | DBR-2 | 1746 |
| Example 8 | SCASN 1 | YAG3 | 104.7 | 53.1 | 46.9 | DBR-3 | 1755 |
| Example 9 | BSESN 2/ BSESN 3 = 15/85 | — | 75.0 | 100.0 | — | DBR-2 | 1764 |
| Example 10 | BSESN 2/ BSESN 3 = 15/85 | — | 75.0 | 100.0 | — | DBR-3 | 1767 |
| Example 11 | KSF | YAG3 | 84.3 | 86.9 | 13.1 | DBR-2 | 1734 |
| Example 12 | KSF | YAG3 | 84.3 | 86.9 | 13.1 | DBR-3 | 1757 |

TABLE 6-continued

|  | Color deviation Duv | Average color rendering index Ra | Full width at half maximum (nm) of emission peak having maximum emission intensity (nm) | Attraction index T | Relative attraction index $T/T_0$ (%) | Spectral component retention ratio (%) |
|---|---|---|---|---|---|---|
| Example 5 | 0.006 | 67 | 87 | 0.294 | 71 | 89.1 |
| Example 6 | 0.006 | 68 | 87 | 0.301 | 72 | 90.3 |
| Example 7 | 0.006 | 48 | 80 | 0.278 | 67 | 89.2 |
| Example 8 | 0.006 | 49 | 80 | 0.281 | 67 | 90.3 |
| Example 9 | 0.007 | 28 | 74 | 0.267 | 64 | 89.3 |
| Example 10 | 0.007 | 28 | 74 | 0.267 | 64 | 90.3 |
| Example 11 | 0.006 | 86 | 4 | 0.315 | 75 | 88.9 |
| Example 12 | 0.006 | 85 | 4 | 0.322 | 77 | 90.2 |

TABLE 7

|  | Chromaticity coordinates | | Special color rendering index | radiance ratio Lp (%) 650-750/ 400-750 |
|---|---|---|---|---|
|  | x | y | R9 | |
| Example 5 | 0.573 | 0.424 | −30 | 23 |
| Example 6 | 0.571 | 0.425 | −28 | 23 |
| Example 7 | 0.572 | 0.426 | −87 | 18 |
| Example 8 | 0.571 | 0.426 | −86 | 18 |
| Example 9 | 0.571 | 0.428 | −135 | 16 |
| Example 10 | 0.571 | 0.428 | −135 | 16 |
| Example 11 | 0.572 | 0.423 | 89 | 9 |
| Example 12 | 0.570 | 0.425 | 92 | 9 |

As listed in Table 4 or Table 6, the light-emitting devices according to Examples 1 to 12 emit light having a correlated color temperature of 1950 K or less, having reduced light on the short wavelength side that sea turtles are sensitive to, and that gives a relaxing atmosphere. Even in a case in which the light-emitting device is used instead of a high-pressure sodium lamp, the color of irradiated objects is natural, and the emitted light causes minimal discomfort to humans. In addition, in the light-emitting devices according to Examples 1 to 12, the full width at half maximum of the emission spectrum indicating the maximum emission intensity was within a range from 3 nm to 110 nm.

The emission peak wavelength in the emission spectrum of the light-emitting device was within a range from 570 nm to 680 nm. Since the full width at half maximum of the emission peak having the maximum emission intensity in the emission spectrum of the light-emitting device was in a range from 3 nm to 110 nm, the light-emitting device could suppress light components that are difficult for humans to perceive and light components on the short wavelength side that affect the behavior of sea turtles. Also, the light-emitting devices according to Examples 1 to 12 can emit light having a sea turtle light attraction index T derived from Equation (1) of 0.416 or less, having reduced sea turtle light attraction, and that makes irradiated objects easily visible to humans.

For the light-emitting devices according to Examples 1 to 4, even in a case of emitting light having a color deviation Duv, which is a deviation from the black body radiation locus, of 0.000 and light having a correlated color temperature of 1950 K or less, regarding the light emitted from the light-emitting devices, the color of irradiated objects is natural and the emitted light causes minimal discomfort to humans. Even in a case in which the light-emitting devices according to Examples 5 to 12 include a dielectric multilayer film as the band-pass filter layer, the light emitted has a color deviation Duv, which is the deviation from the black body radiation locus, in a range from minus (−) 0.008 to plus (+) 0.008, and thus the color of irradiated objects is natural and the emitted light causes minimal discomfort to humans.

As listed in Tables 5 and 7, the light-emitting devices according to Examples 1 to 12 each emitted light with the ratio Lp of the second radiance in a range from 650 nm to 750 nm being 30% or less with respect to 100% of the first radiance in a range from 400 nm to 750 nm. Among the mixed color light emitted from the light-emitting devices according to Examples 1 to 12, there is a relatively small amount of light with red color components on the long wavelength side which are difficult for humans and for sea turtles to perceive. Thus, the light emitted from the light-emitting device gives a relaxing atmosphere without reduced luminance.

The light emitted by the light-emitting devices according to Examples 1 to 12 has a relative attraction index ratio $T/T_0$ in a range from 40% to 99%, makes irradiated objects easily visible to humans and gives a relaxing atmosphere without losing the color balance of the emitted light color.

The light-emitting devices according to Examples 1, 2, 4, 5, 6, 7, 8, 11, and 12 emitted light with an average color rendering index Ra of 40 or greater and a color rendering property that allows simple tasks to be performed without discomfort even when used outdoors or indoors at a place near the outdoors, for example.

Also, the light-emitting devices according to Examples 3, 9, and 10 emitted light having an average color rendering index Ra in a range from 28 to 40, a color rendering property sufficient for use outdoors such as on a road, a sea turtle light attraction index T derived from Equation (1) of 0.416 or less, having reduced sea turtle light attraction, and that makes irradiated objects easily visible to humans.

The light-emitting devices according to Examples 5 to 12, even with a dielectric multilayer film provided as the band-pass filter layer, emitted light that retains 88% or greater of the emission spectrum of light-emitting devices without a band-pass filter layer, has reduced light on the short wavelength side that sea turtles are sensitive to, and makes the irradiated objects easily visible to humans.

The light-emitting devices according to Comparative Examples 1 to 3 emitted light having a correlated color temperature slightly higher than the light emitted by a high-pressure sodium lamp and a sea turtle light attraction index T of greater than 0.416 that is considered to not have a reduced sea turtle light attraction effect.

Figure 14:
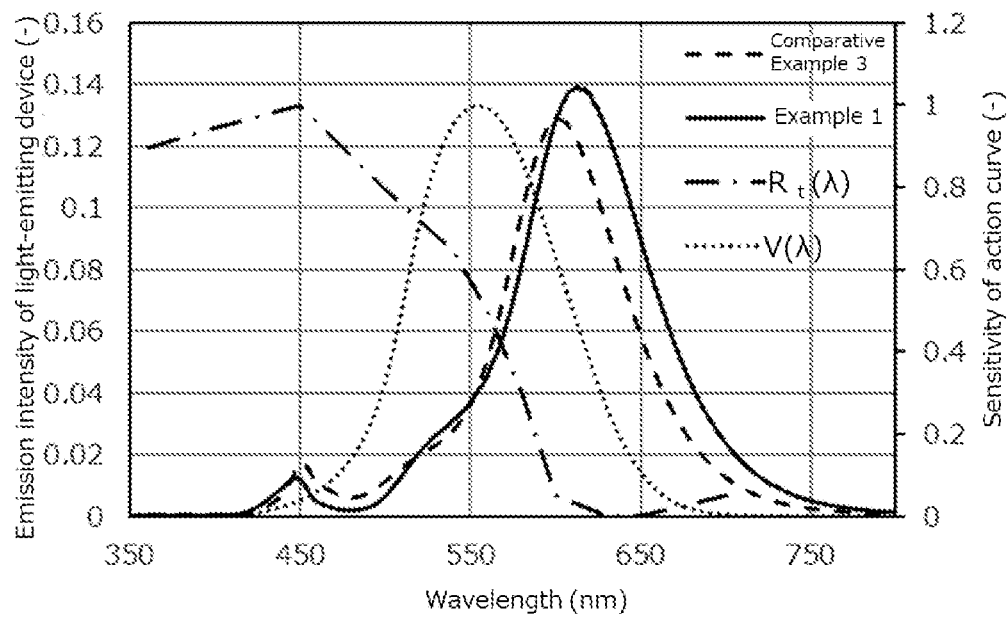
FIG. 14 is a diagram illustrating a spectral radiance, a sea turtle light response curve $R_t(\lambda)$, and a luminous efficiency function for human photopic vision $V(\lambda)$ of a light-emitting device of Example 1 and a light-emitting device of Comparative Example 3.
Figure 15:
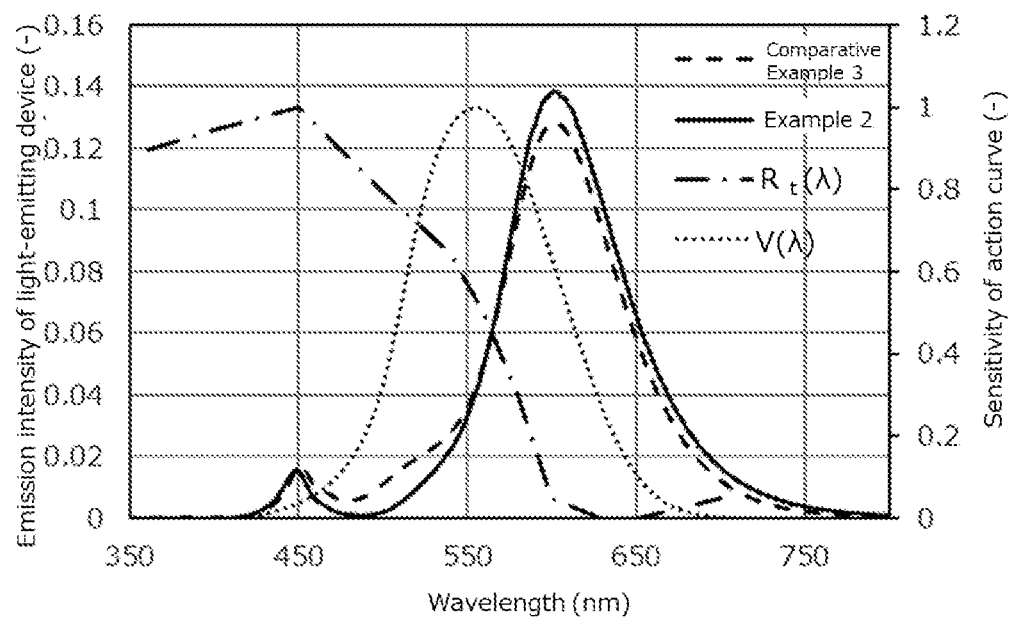
FIG. 15 is a diagram illustrating a spectral radiance, a sea turtle light response curve $R_t(\lambda)$, and a luminous efficiency function for human photopic vision $V(\lambda)$ of a light-emitting device of Example 2 and the light-emitting device of Comparative Example 3.
Figure 16:
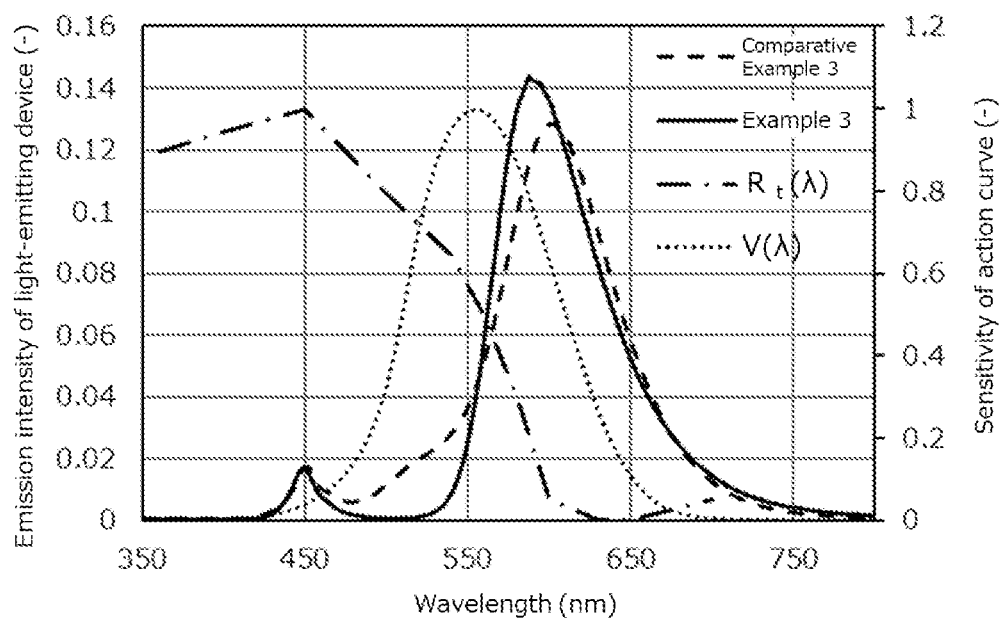
FIG. 16 is a diagram illustrating a spectral radiance, a sea turtle light response curve $R_t(\lambda)$, and a luminous efficiency function for human photopic vision $V(\lambda)$ of a light-emitting device of Example 3 and the light-emitting device of Comparative Example 3.
Figure 17:
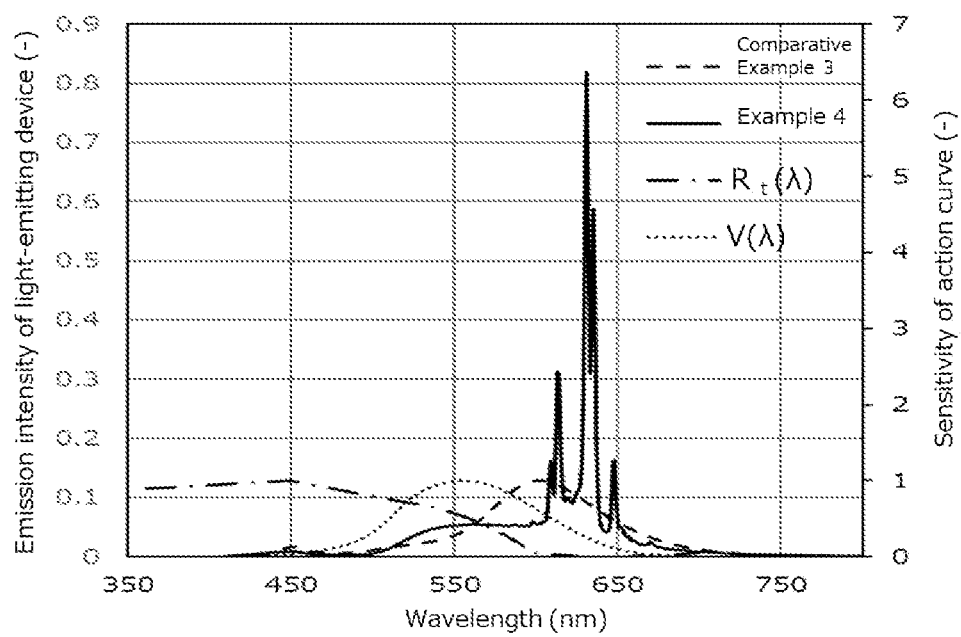
FIG. 17 is a diagram illustrating a spectral radiance, a sea turtle light response curve $R_t(\lambda)$, and a luminous efficiency function for human photopic vision $V(\lambda)$ of a light-emitting device of Example 4 and the light-emitting device of Comparative Example 3.

As illustrated in FIGS. 14 to 16, the light-emitting devices according to Examples 1 to 3 emitted light having a sea turtle light attraction index T of 0.416 or less. Thus, the emission intensity in a wavelength range of 560 nm and less that attracts sea turtles is lower than that of Comparative Example 3, and the emission intensity in a wavelength range of 560 nm and greater is higher than that of Comparative Example 3, making irradiated objects easily visible to humans. As illustrated in FIG. 17, the light-emitting device according to Example 4 has a sea turtle light attraction index T of 0.416 or less, and the emission intensity in a wavelength range of 510 nm and less that attracts sea turtles is lower than that of Comparative Example 3.

Figure 18:
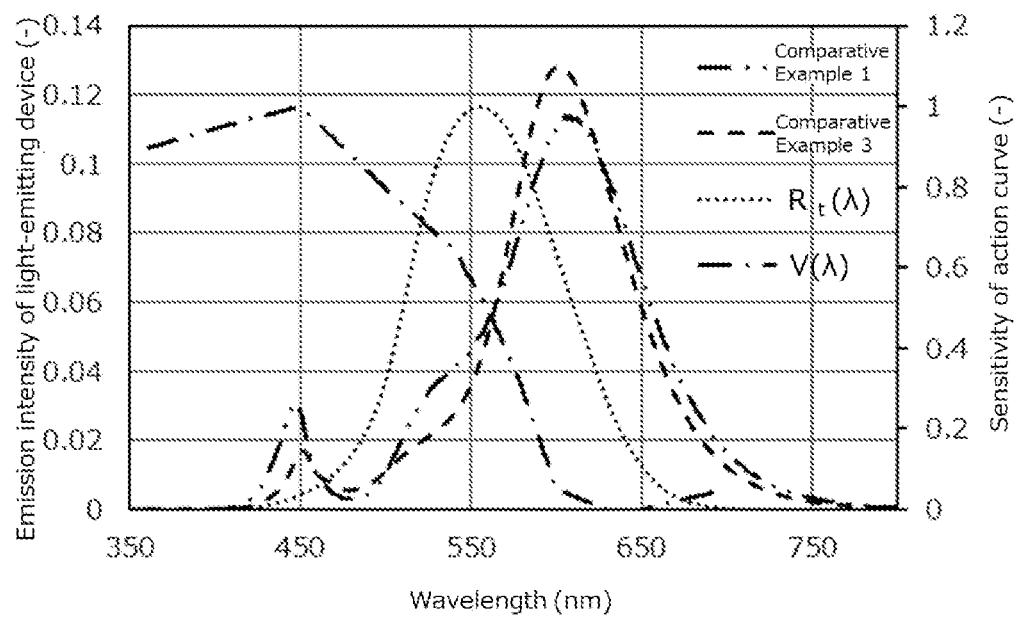
FIG. 18 is a diagram illustrating a spectral radiance, a sea turtle light response curve $R_t(\lambda)$, and a luminous efficiency function for human photopic vision $V(\lambda)$ of a light-emitting device of Comparative Example 1 and the light-emitting device of Comparative Example 3.
Figure 19:
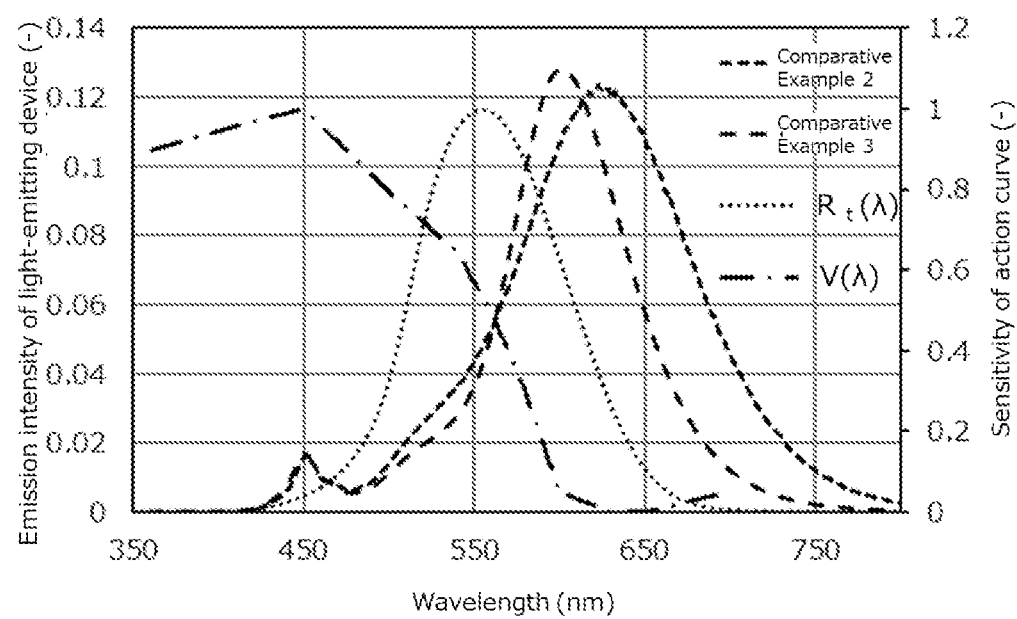
FIG. 19 is a diagram illustrating a spectral radiance, a sea turtle light response curve $R_t(\lambda)$, and a luminous efficiency function for human photopic vision $V(\lambda)$ of a light-emitting device of Comparative Example 2 and the light-emitting device of Comparative Example 3.
Figure 20:
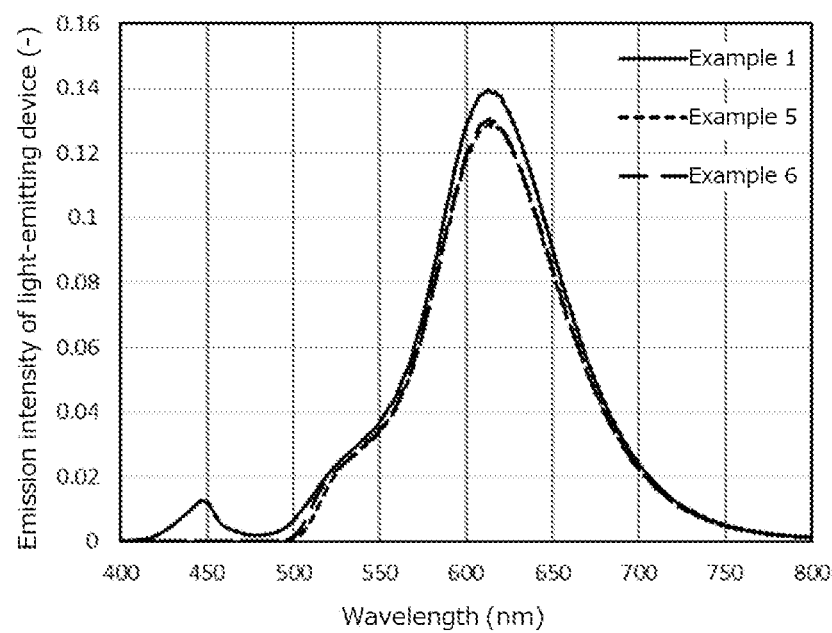
FIG. 20 is a diagram illustrating an emission spectrum of the light-emitting device of Example 1, an emission spectrum of a light-emitting device of Example 5 after transmission through the band-pass filter layer, and an emission spectrum of a light-emitting device of Example 6 after transmission through the band-pass filter layer.
Figure 21:
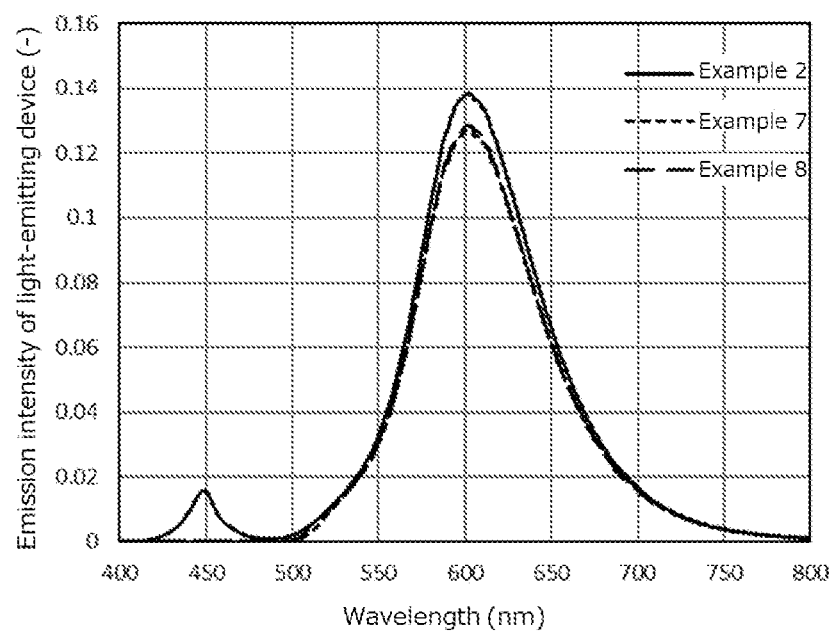
FIG. 21 is a diagram illustrating an emission spectrum of the light-emitting device of Example 2, an emission spectrum of a light-emitting device of Example 7 after transmission through the band-pass filter layer, and an emission spectrum of a light-emitting device of Example 8 after transmission through the band-pass filter layer.
Figure 22:
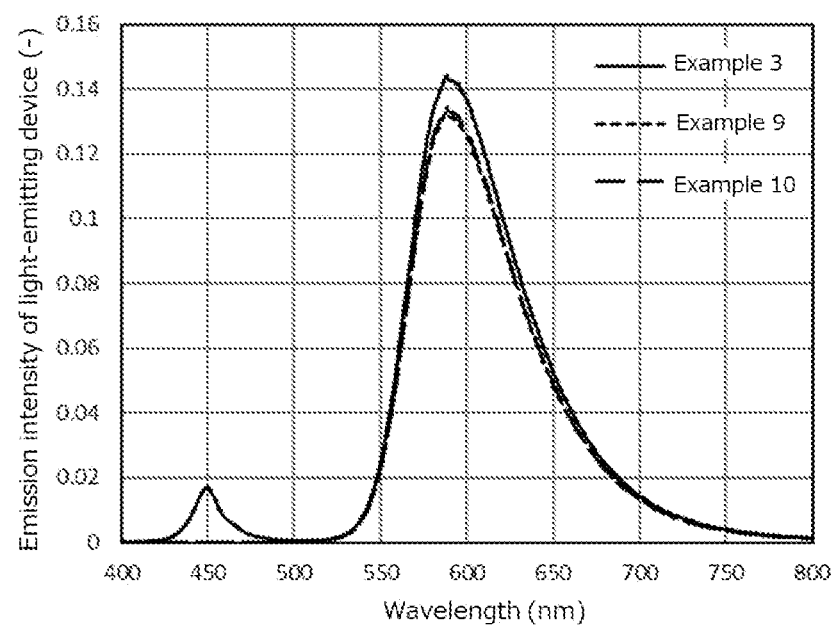
FIG. 22 is a diagram illustrating an emission spectrum of the light-emitting device of Example 3, an emission spectrum of a light-emitting device of Example 9 after transmission through the band-pass filter layer, and an emission spectrum of a light-emitting device of Example 10 after transmission through the band-pass filter layer.
Figure 23:
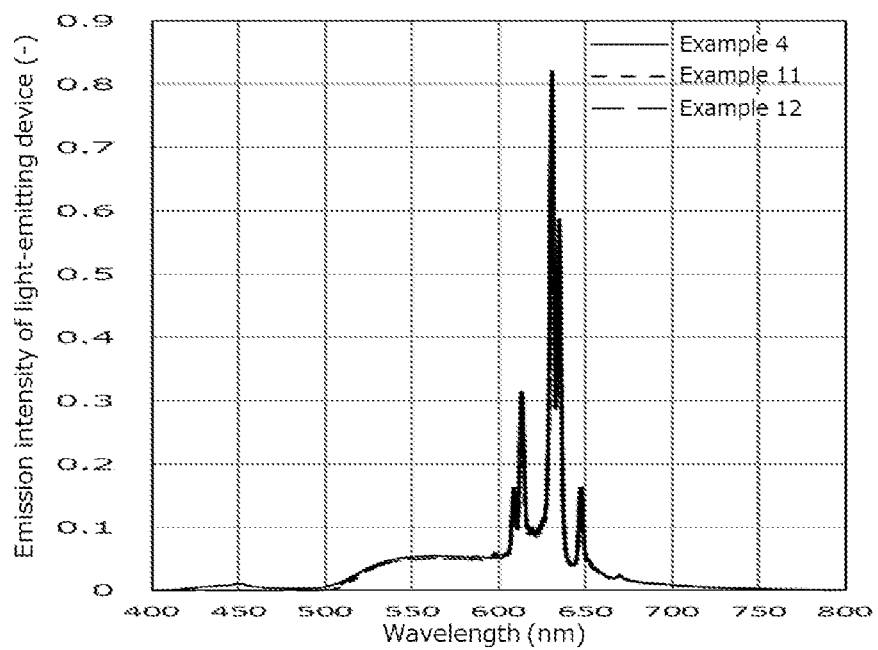
FIG. 23 is a diagram illustrating an emission spectrum of the light-emitting device of Example 4, an emission spectrum of a light-emitting device of Example 11 after transmission through the band-pass filter layer, and an emission spectrum of a light-emitting device of Example 12 after transmission through the band-pass filter layer.

As illustrated in FIGS. 18 and 19, the light-emitting devices according to Comparative Examples 1 to 3 have a sea turtle light attraction index T greater than 0.416, and Comparative Examples 1 and 2 have an emission intensity in a wavelength range of 560 nm and less that attracts sea turtles higher than that of Comparative Example 3 with the lowest attraction index T among the comparative examples and non-reduced sea turtle light attraction.

As illustrated in FIGS. 20 to 23, the light-emitting devices according to Examples 1 to 12, even though provided with a band-pass filter layer and having light emission on the short wavelength side suppressed, emit light with a high emission intensity roughly equal to that of a light-emitting device without a band-pass filter layer and that makes irradiated objects easily visible to humans.

INDUSTRIAL APPLICABILITY

A light-emitting device according to an aspect of the present invention can be used as a light source of a street light for lighting a park, sand beach, road, or the like, a lighting appliance installed outdoors at a harbor or in a tunnel; a lighting appliance or street light expected to be used outdoors such as a headlight, a flashlight, or a portable lantern using LEDs; or a lighting appliance or street light used indoors but at a place near the outdoors such as near an entrance or a window, in particular a place near an area where sea turtles are active.

REFERENCE SIGNS LIST

1 Support
2 First lead
3 Second lead
4 Conductive member
10 Light-emitting element
21, 22, 26 Wavelength conversion member
23 Phosphor layer
24 Band-pass filter layer
24*a* First dielectric layer
24*b* Second dielectric layer
25 Second light-transmissive member
30 First light-transmissive member
32 Light-transmissive bonding member
41 Molded body
42 Resin portion
43 Light reflecting member
50 Sealing member
51 Lens portion
52 Flange portion
60 Wire
70 Phosphor
71 First phosphor
72 Second phosphor
100, 200, 300, 400 Light-emitting device
1000 Street light
1001 Low-position lighting device
B Placement platform
C1, C2 Roadway
Le Light source
P Pole
S Support portion
T Light transmitting portion
W Sidewalk

What is claimed is:

1. A light-emitting device comprising:
a light-emitting element having an emission peak wavelength within a range from 400 nm to 490 nm; and
a first phosphor having an emission peak wavelength within a range from 570 nm to 680 nm, wherein
the light-emitting device emits light that has a correlated color temperature of 1950 K or less, an average color rendering index Ra of 40 or greater, a full width at half maximum of an emission spectrum indicating a maximum emission intensity in an emission spectrum of the light-emitting device of 110 nm or less, and a sea turtle light attraction index T derived from Equation (1) of 0.416 or less, $$T = \frac{\int_{360}^{700} S(\lambda) \times R_t(\lambda) d\lambda}{\int_{380}^{730} S(\lambda) \times V(\lambda) d\lambda} \quad (1)$$

where $S(\lambda)$ is a spectral radiance of light emitted by the light-emitting device, $V(\lambda)$ is a spectral luminous efficiency function for human photopic vision specified by the Commission Internationale de l'Eclairage (CIE), and $R_t(\lambda)$ is a sea turtle light response curve.

2. A light-emitting device comprising:
a light-emitting element having an emission peak wavelength within a range from 400 nm to 490 nm; and
a first phosphor having an emission peak wavelength within a range from 570 nm to 680 nm, wherein
the first phosphor includes a first nitride phosphor having a composition represented by Formula (1A), and
the light-emitting device emits light that has a correlated color temperature of 1950 K or less, a full width at half maximum of an emission spectrum indicating a maximum emission intensity in an emission spectrum of the light-emitting device of 110 nm or less, and a sea turtle light attraction index T derived from Equation (1) of 0.416 or less, $$M^1{}_2Si_5N_8:Eu \quad (1A)$$

where $M^1$ is an alkaline earth metal element including at least one selected from the group consisting of Ca, Sr, and Ba, and $$T = \frac{\int_{360}^{700} S(\lambda) \times R_t(\lambda) d\lambda}{\int_{380}^{730} S(\lambda) \times V(\lambda) d\lambda} \quad (1)$$

where S(λ) is a spectral radiance of light emitted by the light-emitting device, V(λ) is a spectral luminous efficiency function for human photopic vision specified by the Commission Internationale de l'Eclairage (CIE), and $R_t(\lambda)$ is a sea turtle light response curve.

3. The light-emitting device according to claim 1, wherein the first phosphor includes at least one selected from the group consisting of a first nitride phosphor having a composition represented by Formula (1A), a second nitride phosphor having a composition represented by Formula (1B), a first fluoride phosphor having a composition represented by Formula (1C), and a second fluoride phosphor having a composition represented by Formula (1C') with a different composition to that represented by Formula (1C), $$M^1{}_2Si_5N_8:Eu \tag{1A}$$

where $M^1$ is an alkaline earth metal element including at least one selected from the group consisting of Ca, Sr, and Ba, and $$Sr_qCa_sAl_tSi_uN_v:Eu \tag{1B}$$

where q, s, t, u, and v satisfy 0≤q<1, 0<s≤1, q+s≤1, 0.9≤t≤1.1, 0.9≤u≤1.1, and 2.5≤v≤3.5, $$A_c[M^2{}_{1-b}Mn^{4+}{}_bF_d] \tag{1C}$$

where A includes at least one selected from the group consisting of $K^+$, $Li^+$, $Na^+$, $Rb^+$, $Cs^+$, and $NH_4^+$, $M^2$ includes at least one element selected from the group consisting of Group 4 elements and Group 14 elements, b satisfies 0<b<0.2, c is an absolute value of electric charge of $[M^2{}_{1-b}Mn^{4+}{}_bF_d]$ ion, and d satisfies 5<d<7, $$A'_{c'}[M^{2'}{}_{1-b'}Mn^{4+}{}_{b'}F_{d'}] \tag{1C'}$$

where A' includes at least one selected from the group consisting of $K^+$, $Li^+$, $Na^+$, $Rb^+$, $Cs^+$, and $NH_4^+$, $M^{2'}$ includes at least one element selected from the group consisting of Group 4 elements, Group 13 elements, and Group 14 elements, b' satisfies 0<b'<0.2, c' is an absolute value of electric charge of $[M^{2'}{}_{1-b'}Mn^{4+}{}_{b'}F_{d'}]$ ion, and d' satisfies 5<d'<7.

4. The light-emitting device according to claim 1, wherein the first phosphor further includes at least one selected from the group consisting of a second nitride phosphor having a composition represented by Formula (1B), a first fluoride phosphor having a composition represented by Formula (1C), and a second fluoride phosphor having a composition represented by Formula (1C') with a different composition to that represented by Formula (1C), $$Sr_qCa_sAl_tSi_uN_v:Eu \tag{1B}$$

where q, s, t, u, and v satisfy 0≤q<1, 0<s≤1, q+s≤1, 0.9≤t≤1.1, 0.9≤u≤1.1, and 2.5≤v≤3.5, $$A_c[M^2{}_{1-b}Mn^{4+}{}_bF_d] \tag{1C}$$

where A includes at least one selected from the group consisting of $K^+$, $Li^+$, $Na^+$, $Rb^+$, $Cs^+$, and $NH_4^+$, $M^2$ includes at least one element selected from the group consisting of Group 4 elements and Group 14 elements, b satisfies 0<b<0.2, c is an absolute value of electric charge of $[M^2{}_{1-b}Mn^{4+}{}_bF_d]$ ion, and d satisfies 5<d<7, $$A'_{c'}[M^{2'}{}_{1-b'}Mn^{4+}{}_{b'}F_{d'}] \tag{1C'}$$

where A' includes at least one selected from the group consisting of $K^+$, $Li^+$, $Na^+$, $Rb^+$, $Cs^+$, and $NH_4^+$, $M^{2'}$ includes at least one element selected from the group consisting of Group 4 elements, Group 13 elements, and Group 14 elements, b' satisfies 0<b'<0.2, c' is an absolute value of electric charge of $[M^{2'}{}_{1-b'}Mn^{4+}{}_{b'}F_{d'}]$ ion, and d' satisfies 5<d'<7.

5. The light-emitting device according to claim 2, wherein the first phosphor further includes at least one selected from the group consisting of a second nitride phosphor having a composition represented by Formula (1B), a first fluoride phosphor having a composition represented by Formula (1C), and a second fluoride phosphor having a composition represented by Formula (1C') with a different composition to that represented by Formula (1C), $$Sr_qCa_sAl_tSi_uN_v:Eu \tag{1B}$$

where q, s, t, u, and v satisfy 0≤q<1, 0<s≤1, q+s≤1, 0.9≤t≤1.1, 0.9≤u≤1.1, and 2.5≤v≤3.5, $$A_c[M^2{}_{1-b}Mn^{4+}{}_bF_d] \tag{1C}$$

where A includes at least one selected from the group consisting of $K^+$, $Li^+$, $Na^+$, $Rb^+$, $Cs^+$, and $NH_4^+$, $M^2$ includes at least one element selected from the group consisting of Group 4 elements and Group 14 elements, b satisfies 0<b<0.2, c is an absolute value of electric charge of $[M^2{}_{1-b}Mn^{4+}{}_bF_d]$ ion, and d satisfies 5<d<7, $$A'_{c'}[M^{2'}{}_{1-b'}Mn^{4+}{}_{b'}F_{d'}] \tag{1C'}$$

where A' includes at least one selected from the group consisting of $K^+$, $Li^+$, $Na^+$, $Rb^+$, $Cs^+$, and $NH_4^+$, $M^{2'}$ includes at least one element selected from the group consisting of Group 4 elements, Group 13 elements, and Group 14 elements, b' satisfies 0<b'<0.2, c' is an absolute value of electric charge of $[M^{2'}{}_{1-b'}Mn^{4+}{}_{b'}F_{d'}]$ ion, and d' satisfies 5<d'<7.

6. The light-emitting device according to claim 1, wherein the first phosphor has a full width at half maximum of an emission spectrum indicating a maximum emission intensity in an emission spectrum of the first phosphor within a range from 3 nm to 120 nm.

7. The light-emitting device according to claim 2, wherein the first phosphor has a full width at half maximum of an emission spectrum indicating a maximum emission intensity in an emission spectrum of the first phosphor within a range from 3 nm to 120 nm.

8. The light-emitting device according to claim 1, further comprising:
a second phosphor having an emission peak wavelength within a range from 480 nm to less than 570 nm.

9. The light-emitting device according to claim 2, further comprising:
a second phosphor having an emission peak wavelength within a range from 480 nm to less than 570 nm.

10. The light-emitting device according to claim 8, wherein
the second phosphor includes at least one type of rare earth aluminate phosphor having a composition represented by Formula (2A), $$Ln^1{}_3(Al_{1-a}Ga_a)_5O_{12}:Ce \tag{2A}$$

where $Ln^1$ is at least one element selected from the group consisting of Y, Gd, Tb, and Lu, and a satisfies 0≤a≤0.5.

11. The light-emitting device according to claim 9, wherein
the second phosphor includes at least one type of rare earth aluminate phosphor having a composition represented by Formula (2A), $$Ln^1{}_3(Al_{1-a}Ga_a)_5O_{12}:Ce \tag{2A}$$

where $Ln^1$ is at least one element selected from the group consisting of Y, Gd, Tb, and Lu, and a satisfies 0≤a≤0.5.

12. The light-emitting device according to claim 8, wherein
the second phosphor has a full width at half maximum of an emission spectrum indicating a maximum emission intensity in an emission spectrum of the second phosphor within a range from 20 nm to 125 nm.

13. The light-emitting device according to claim 9, wherein
the second phosphor has a full width at half maximum of an emission spectrum indicating a maximum emission intensity in an emission spectrum of the second phosphor within a range from 20 nm to 125 nm.

14. The light-emitting device according to claim 8, wherein
a content of the first phosphor relative to a total amount of the first phosphor and the second phosphor is within a range from 5 mass % to 95 mass %.

15. The light-emitting device according to claim 9, wherein
a content of the first phosphor relative to a total amount of the first phosphor and the second phosphor is within a range from 5 mass % to 95 mass %.

16. The light-emitting device according to claim 1, wherein
the light-emitting device emits light with a color deviation Duv from a black body radiation locus in a range from −0.008 to +0.008.

17. The light-emitting device according to claim 1, wherein
the light-emitting device emits light with a second radiance in a range from 650 nm to 750 nm being 50% or less relative to 100% of a first radiance in a range from 400 nm to 750 nm.

18. The light-emitting device according to claim 1, wherein
on a light emission side of the light-emitting element, a wavelength conversion member including a phosphor layer including the first phosphor and a band-pass filter layer disposed on a light emission side of the phosphor layer is provided, and
the band-pass filter layer has an average reflectivity of light with a wavelength range from 380 nm to less than 495 nm of 80% or greater and has an average reflectivity of light with a wavelength range from greater than 580 nm to 780 nm of 20% or less, with respect to light with an angle of incidence within a range from 0 degrees to 30 degrees.

19. A lighting appliance comprising:
the light-emitting device described in claim 1.

20. A street light comprising:
the light-emitting device described in claim 1.

* * * * *